US 9,021,657 B2
May 5, 2015

(12) United States Patent
Park et al.

(10) Patent No.: US 9,021,657 B2
(45) Date of Patent: May 5, 2015

(54) PORTABLE ELECTRONIC DEVICE

(71) Applicant: Samsung Electronics Co., Ltd, Suwon-si, Gyeonggi-do (KR)

(72) Inventors: Young-sun Park, Yongin-si (KR); Bo-won Jung, Gunpo-si (KR)

(73) Assignee: Samsung Electronics Co., Ltd., Suwon-Si (KR)

(*) Notice: Subject to any disclaimer, the term of this patent is extended or adjusted under 35 U.S.C. 154(b) by 0 days.

(21) Appl. No.: 14/169,273

(22) Filed: Jan. 31, 2014

(65) Prior Publication Data

US 2014/0217875 A1 Aug. 7, 2014

Related U.S. Application Data

(60) Provisional application No. 61/761,989, filed on Feb. 7, 2013, provisional application No. 61/766,266, filed on Feb. 19, 2013.

(30) Foreign Application Priority Data

May 30, 2013 (KR) .......................... 10-2013-0062154

(51) Int. Cl.
*E05D 15/00* (2006.01)
*H05K 5/02* (2006.01)
*G06F 1/16* (2006.01)

(52) U.S. Cl.
CPC ............ *H05K 5/0226* (2013.01); *G06F 1/1616* (2013.01); *G06F 1/1681* (2013.01)

(58) Field of Classification Search
USPC .......... 16/271, 270, 272, 254, 382, 384, 387, 16/354, 365, 366, 368; 361/679.08, 361/679.11, 679.02, 679.15, 679.27, 361/679.21, 679.09, 679.22; 455/90.3, 455/575.1, 575.3, 575.8; 379/433.12, 379/433.13; 348/373, 333.01, 333.06, 794; 248/274.1, 284.1, 286.1, 287.1, 419, 248/420
See application file for complete search history.

(56) References Cited

U.S. PATENT DOCUMENTS

| 3,680,927 | A | * | 8/1972 | Neureuther ................... 305/50 |
| 5,363,089 | A | * | 11/1994 | Goldenberg ................. 340/7.63 |
| 6,223,393 | B1 | | 5/2001 | Knopf |
| 8,170,630 | B2 | | 5/2012 | Murayama et al. |
| 8,254,103 | B2 | | 8/2012 | Park et al. |
| 2007/0226955 | A1 | * | 10/2007 | Cho et al. ...................... 16/354 |
| 2009/0070961 | A1 | * | 3/2009 | Chung et al. .................. 16/354 |

(Continued)

FOREIGN PATENT DOCUMENTS

| JP | 2008-228249 | 9/2008 |
| JP | 2009-225193 | 10/2009 |

(Continued)

*Primary Examiner* — Chuck Mah
(74) *Attorney, Agent, or Firm* — Staas & Halsey LLP

(57) ABSTRACT

A portable electronic device includes first and second device units and at least one hinge assembly configured to pivotably connect the second device unit to the first device unit. The hinge assembly includes a first fixing unit configured to be fixed to the first device unit, a second fixing unit configured to be fixed to the second device unit, a plurality of shaft members configured to be arranged in parallel with one another and to include first and second outer shaft members respectively mounted on the first and second fixing units and a plurality of inner shaft members arranged between the first and second outer shaft members, and a gear unit mounted on the shaft members to connect the plurality of shaft members with one another through a gear mesh.

18 Claims, 30 Drawing Sheets

(56) References Cited

U.S. PATENT DOCUMENTS

| | | |
|---|---|---|
| 2010/0232100 A1* | 9/2010 | Fukuma et al. .......... 361/679.01 |
| 2011/0000136 A1* | 1/2011 | Brun ............................... 49/358 |
| 2011/0063783 A1* | 3/2011 | Shim et al. ............... 361/679.01 |
| 2011/0157780 A1* | 6/2011 | Wang et al. .............. 361/679.01 |
| 2011/0289728 A1* | 12/2011 | Wang et al. ..................... 16/337 |
| 2012/0096678 A1* | 4/2012 | Zhang et al. .................... 16/302 |
| 2012/0264489 A1 | 10/2012 | Choi et al. |

FOREIGN PATENT DOCUMENTS

| | | |
|---|---|---|
| KR | 10-2011-0039870 | 4/2011 |
| KR | 10-20110100936 | 9/2011 |
| KR | 10-2012-0117140 | 10/2012 |

* cited by examiner

PORTABLE ELECTRONIC DEVICE

CROSS-REFERENCE TO RELATED APPLICATIONS

This application claims the benefit of priority under 35 U.S.C. §119 to U.S. Provisional Patent Application No. 61/761,989, filed on Feb. 7, 2013, U.S. Provisional Patent Application No. 61/766,266, filed on Feb. 19, 2013, and Korean Patent Application No. 10-2013-0062154, filed on May 30, 2013, the content of each of which is incorporated herein in its entirety by reference.

BACKGROUND OF THE INVENTION

1. Field of the Invention

The present general inventive concept generally relates to providing a portable electronic device, and more particularly, to providing a portable electronic device that includes a display unit that pivots about a main body.

2. Description of the Related Art

In a portable electronic device that includes a main body and a display unit, like a laptop computer, the display unit is generally installed to pivot about the main body and configured to be disposed at various angles with respect to the main body.

The display unit of the portable electronic device is connected to the main body through at least one hinge to pivot about the main body. In this case, a general hinge does not smoothly connect the display unit to the main body. This may detract from the external appearance and utility of the portable electronic device.

SUMMARY OF THE INVENTION

The present general inventive concept provides a hinge assembly that smoothly connects a first device (for example, a main body) and a second device (for example, a display unit) to each other and a portable electronic device that includes the hinge assembly.

Additional features and utilities of the present general inventive concept will be set forth in part in the description which follows and, in part, will be obvious from the description, or may be learned by practice of the general inventive concept.

The foregoing and/or other features and utilities of the present general inventive concept may be achieved by providing a portable electronic device that includes first and second device units and at least one hinge assembly configured to pivotably connect the second device unit to the first device unit. The hinge assembly may include a first fixing unit configured to be fixed to the first device unit, a second fixing unit configured to be fixed to the second device unit, a plurality of shaft members configured to be arranged in parallel with one another and to include first and second outer shaft members respectively mounted on the first and second fixing units and a plurality of inner shaft members arranged between the first and second outer shaft members, and a gear unit mounted on the shaft members to connect the plurality of shaft members with one another through a gear mesh.

The gear unit may include first and second gear train configured to be arranged in parallel with each other.

The first gear train may include a first outer gear member configured to be coupled with the first outer shaft member, a second outer gear member configured to be coupled with the second outer shaft member, and a first group of coupling gear members mounted on the plurality of inner shaft members, at least two neighboring inner shaft members are connected to each other by one coupling gear member.

The second gear train may include a second group of coupling gear members mounted on the first outer shaft member, the second outer shaft member, and the plurality of inner shaft members.

A total number of the plurality of shaft members may be N, a number of the first group of coupling gear members may be (N/2)−1, and a number of the second group of coupling gear members may be N/2, wherein N is a natural number that is an even number.

Each of the coupling gear members may include a first gear part configured to be rotatably coupled with a first shaft member of two neighboring shaft members, and a second gear part configured to be rotatably coupled with a second shaft member of the two neighboring shaft members.

The hinge assembly may further include a plurality of coupler members, wherein any two neighboring shaft members are connected to each other by one of the plurality of coupler members.

Each of the coupler members may include a first coupler part configured to be rotatably coupled with a first shaft member of the any two neighboring shaft members, and a second coupler part configured to be rotatably coupled with a second shaft member of the any two neighboring shaft members.

Each of the shaft members may include at least one elastic unit configured to prevent the second device unit from pivoting due to an external torque lower than a threshold value.

The first gear train may include a first outer gear member configured to be mounted on the first outer shaft member, a second outer gear member configured to be mounted on the second outer shaft member, and a plurality of inner gear members configured to be respectively fixedly coupled with the inner shaft members.

The hinge assembly may further include a plurality of coupler members, wherein any two neighboring shaft members are connected to each other by one of the plurality of coupler members.

The portable electronic device may further include a cover unit configured to cover the at least one hinge assembly from an outside.

The hinge assembly may include a first hinge assembly and a second hinge assembly configured to have a same structure as the first hinge assembly and to keep a distance from the first hinge assembly in a direction of a pivot axis. The cover unit may include a plurality of cover members configured to cover at least some of the plurality of shaft members, and each of the cover members may be configured to cover a first shaft member of the first hinge assembly and a second shaft member of the second hinge assembly that corresponds to the first shaft member.

When the second device unit is disposed at a maximum angle with respect to the first device unit, each of the cover members may have at least one maximum angle determining surface that interferes with a movement of a neighboring cover member.

The foregoing and/or other features and utilities of the present inventive concept also provide a hinge assembly configured to pivotably connect first and second device units of a portable electronic device. The hinge assembly may include a first fixing unit configured to be fixed to the first device, a second fixing unit to be fixed to the second device unit, a plurality of shaft members configured to be disposed in parallel with one another and to include first and second outer shaft members respectively mounted on the first and second fixing units and a plurality of inner shaft member disposed between the first and second outer shaft members, and a gear unit configured to be mounted on the plurality of shaft members so as to connect the plurality of shaft members with one another through a gear mesh.

The foregoing and/or other features and utilities of the present inventive concept also provide a portable device including first and second device units and at least one hinge assembly configured to pivotably connect the second device unit to the first device unit. The hinge assembly may include a plurality of shaft members configured to be disposed in parallel with one another, wherein each of the plurality of shaft members includes at least one elastic unit configured to apply torque opposite to an external torque to the shaft member in order to prevent the second device unit from pivoting due to the external torque being lower than a threshold value.

The elastic unit may include at least one spring washer configured to provide an elastic force to the shaft member toward a shaft in order to generate the torque opposite to the external torque.

The hinge assembly may further include a first fixing unit configured to be fixed to the first device unit and a second fixing unit configured to be fixed to the second device unit. The plurality of shaft members may include a first outer shaft member configured to be mounted on the first fixing unit, a second outer shaft member configured to be mounted on the second fixing unit, and a plurality of inner shaft members configured to be disposed between the first and second outer shaft members.

The hinge assembly may further include a gear unit mounted on the shaft members to connect the plurality of shaft members with one another through a gear mesh.

The foregoing and/or other features and utilities of the present inventive concept also provide a hinge assembly configured to pivotably connect first and second device units of a portable device. The hinge assembly may include a plurality of shaft members, wherein each of the plurality of shaft members includes at least one elastic unit configured to apply torque opposite to an external torque to the shaft member in order to prevent the second device unit from pivoting due to the external torque being lower than a threshold value.

The foregoing and/or other features and utilities of the present inventive concept also provide a portable electronic device including first and second device units, first and second hinge assemblies configured to pivotably connect the second device unit to the first device unit and to be spaced apart from each other along a pivot shaft and to have same structures, and a cover unit configured to cover the first and second hinge assemblies. Each of the hinge assemblies may include a plurality of shaft members configured to be arranged in parallel with one another, and the cover unit may include a plurality of cover members configured to cover some or all of the plurality of shaft members, wherein each of the cover members is configured to cover a first shaft member of the first hinge assembly and a second shaft member of the second hinge assembly that corresponds to the first shaft member.

When the second device unit is disposed at a maximum angle with respect to the first device unit, each of the cover members may have at least one maximum angle determining surface that interferes with a movement of a neighboring cover member.

BRIEF DESCRIPTION OF THE DRAWINGS

These and/or features and utilities of the present general inventive concept will become apparent and more readily appreciated from the following description of the embodiments, taken in conjunction with the accompanying drawings of which.

DETAILED DESCRIPTION OF THE EMBODIMENTS

Figure 1:
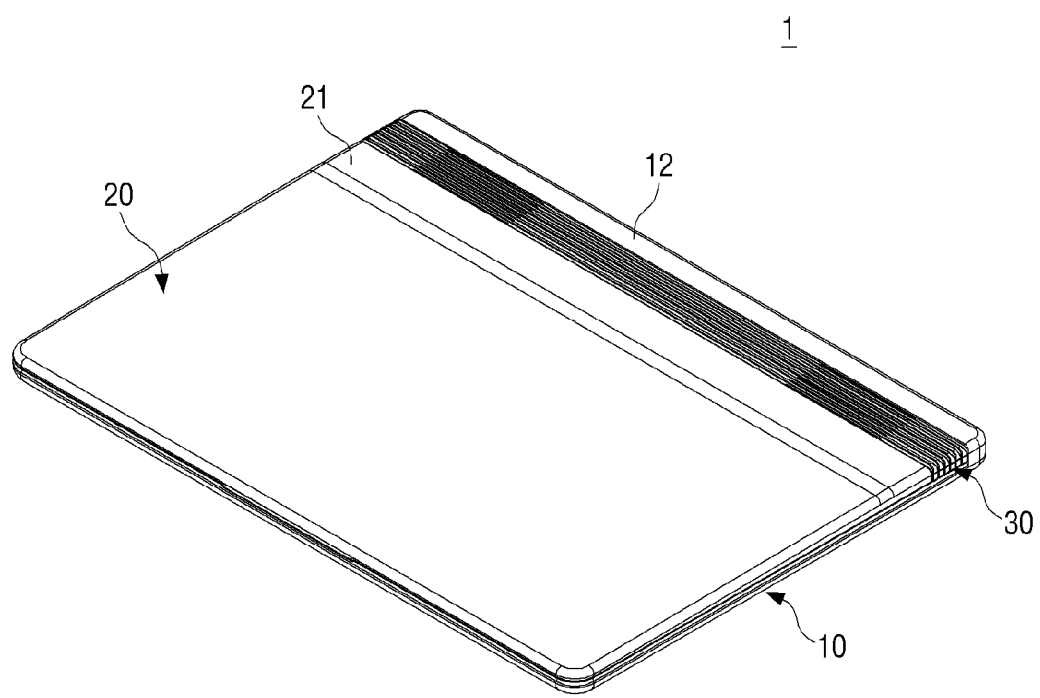
FIG. 1 is a perspective view illustrating a portable electronic device in a folded state, according to an exemplary embodiment of the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures.

The matters defined in the description, such as detailed construction and elements, are provided to assist in a comprehensive understanding of the present general inventive concept. Thus, it is apparent that the exemplary embodiments may be carried out without those specifically defined matters. Also, well-known functions or constructions are not described in detail since they would obscure the exemplary embodiments with unnecessary detail.

FIGS. 1 through 4 illustrate a portable electronic device 1 according to an exemplary embodiment of the present general inventive concept. In the exemplary embodiment illustrated in FIGS. 1 through 10C, the portable electronic device 1 is illustrated as a laptop computer. However, the present general inventive concept may be similarly applied to other types of electronic devices, each of which includes at least one device unit installed to pivot about a main body in order to perform folding and unfolding operations.

The portable electronic device 1 may include a first device unit 10 and a second device unit 20.

The first device unit 10 may constitute a main body of the portable electronic device 1, and a plurality of input keys 13 and a touch pad 14 may be formed on an upper surface of the first device unit 10. A controller (not illustrated) may be embedded in a circuit board form in the first device unit 10 to control an operation of the portable electronic device 1.

The first device unit 10 may include a base part 11 that may be placed on a place such as, for example, a table, knees, or the like, and a hinge mounting part 12 that may vertically protrude from an end of the base part 11. The hinge mounting part 12 may be coupled with a side of a hinge assembly that is described below.

The second device unit 20 may constitute, for example, a display unit of the portable electronic device 1, and a display screen 23 may be formed on an internal surface of the second device unit 20. The second device unit 20 may include a display panel such as, for example, a liquid crystal display (LCD) panel, an organic light-emitting diode (OLED), or the like, to provide the display screen 23.

The second device unit 20 may pivot about a pivot axis P1 (see FIG. 3) with respect to the first device unit 10. For example, referring to FIG. 4, the second device unit 20 may pivot in a direction (i.e., in direction A) in which the second device unit 20 is folded toward the first device unit 10 or in a direction (i.e., in direction B) in which the second device unit 20 is unfolded from the first device unit 10.

Figure 2:
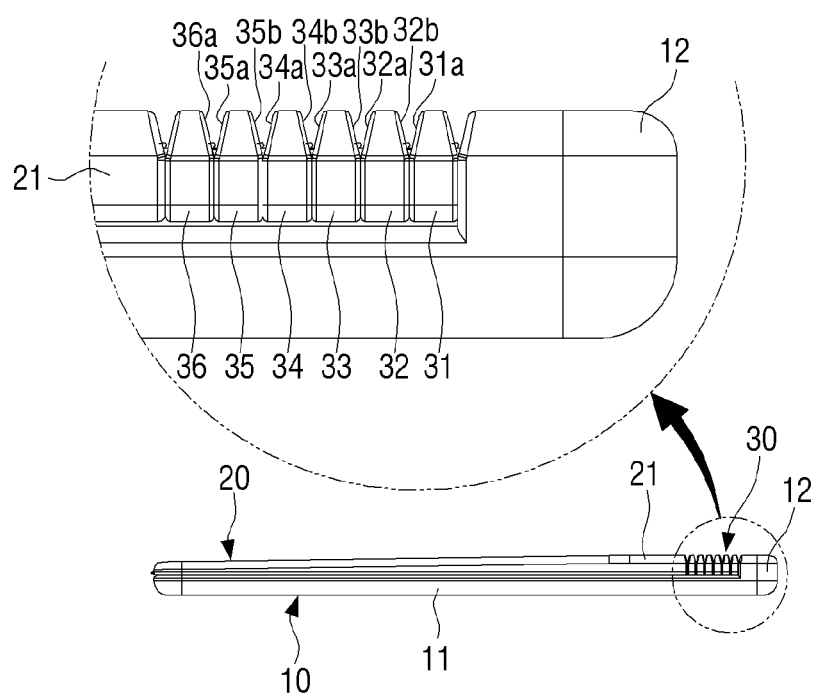
FIG. 2 is a side view of the portable electronic device of FIG. 1.
Figure 3:
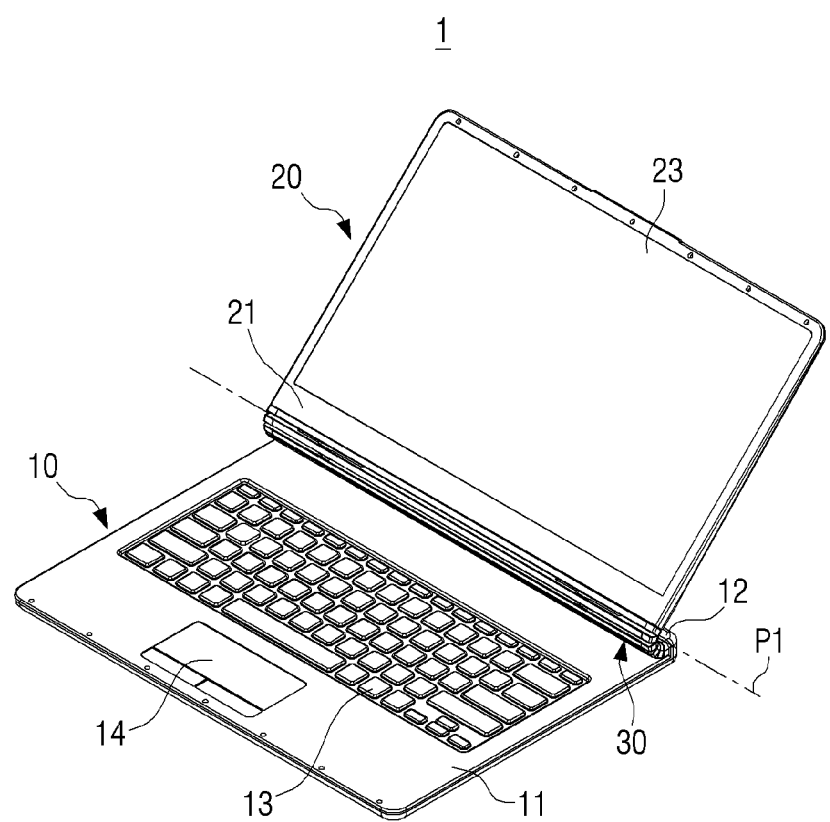
FIG. 3 is a perspective view illustrating the portable electronic device of FIG. 1 in a partly unfolded state.
Figure 4:
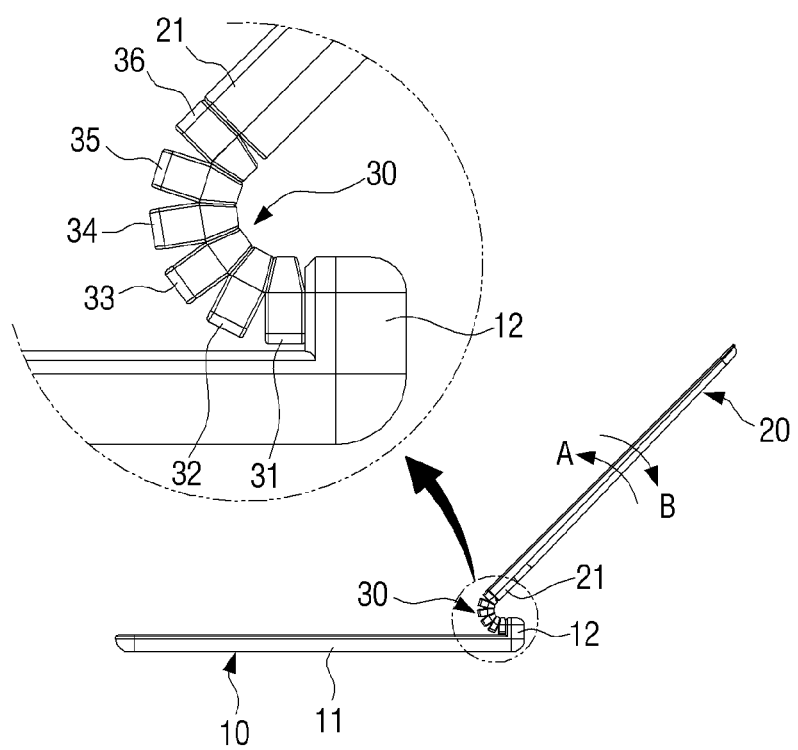
FIG. 4 is a side view of the portable electronic device of FIG. 3.

Therefore, the second device unit 20 may be disposed at various angles with respect to the first device unit 10. As shown in FIGS. 1 and 2, the second device unit 20 may be fully folded toward the first device unit 10. For example, an angle between the first and second device units 10 and 20 is 0°. As shown in FIGS. 3 and 4, the second device unit 20 may be unfolded from the first device unit 10 to expose the display screen 23 to the outside. FIGS. 3 and 4 illustrate the portable electronic device unit 1 in a fully unfolded state. For example, an angle between the second device unit 20 and the first device unit 10 may be about 120°. Alternatively, a maximum angle may be set to other values (for example, 130°, 150°, 180°, or the like).

The portable electronic device 1 may further include a cover unit 30 that may be disposed between the hinge mounting part 12 of the first device unit 10 and a lower part 21 of the second device unit 20.

The cover unit 30 may cover hinge assemblies 100A and 100B (see FIG. 5), which are described below. The cover unit 30 may include, for example, six cover members 31 through 36 that may extend by a width of the second device unit 20 along the pivot axis P1. For convenience of description, the cover members 31 through 36 may be referred to, respectively, as a first cover member 31, a second cover member 32, a third cover member 33, a fourth cover member 34, a fifth cover member 35, and a sixth (i.e., last) cover member 36, according to an order of proximity of each cover member with respect to the hinge mounting part 12 of the first device unit 10.

Referring to FIG. 2, each of the first through sixth cover members 31 through 36 may have at least one maximum angle determining surface. In other words, the first cover member 31 may have a maximum angle determining surface 31a, the second cover member 32 may have maximum angle determining surfaces 32a and 32b, and the third cover member 33 may have maximum angle determining surfaces 33a and 33b. Also, the fourth cover unit 34 may have maximum angle determining surfaces 34a and 34b, the fifth cover unit 35 may have maximum angle determining surfaces 35a and 35b, and the sixth cover member 36 may have a maximum angle determining surface 36a.

When the second device unit 20 is disposed, for example, at an angle of 120° (i.e., at a maximum set angle) with respect to the first device unit 10 as illustrated in FIGS. 3 and 4, each maximum angle determining surface may contact a maximum angle determining surface of a neighboring cover member to interfere with a movement of the neighboring cover member. For example, the maximum angle determining surface 31a of the first cover member 31 may contact the maximum angle determining surface 32b of the second cover member that may neighbor the first cover member 31. Also, the maximum angle determining surface 33a of the third cover member 33 may contact the maximum angle determining surface 34b of the fourth cover member 34 that may neighbor the third cover member 33. Additional pivoting of the second device 20 in the direction B may be limited by contacts between maximum angle determining surfaces. Therefore, a maximum angle between the second device unit 20 and the first device unit 10 may be determined to be, for example, about 120°.

Figure 5:
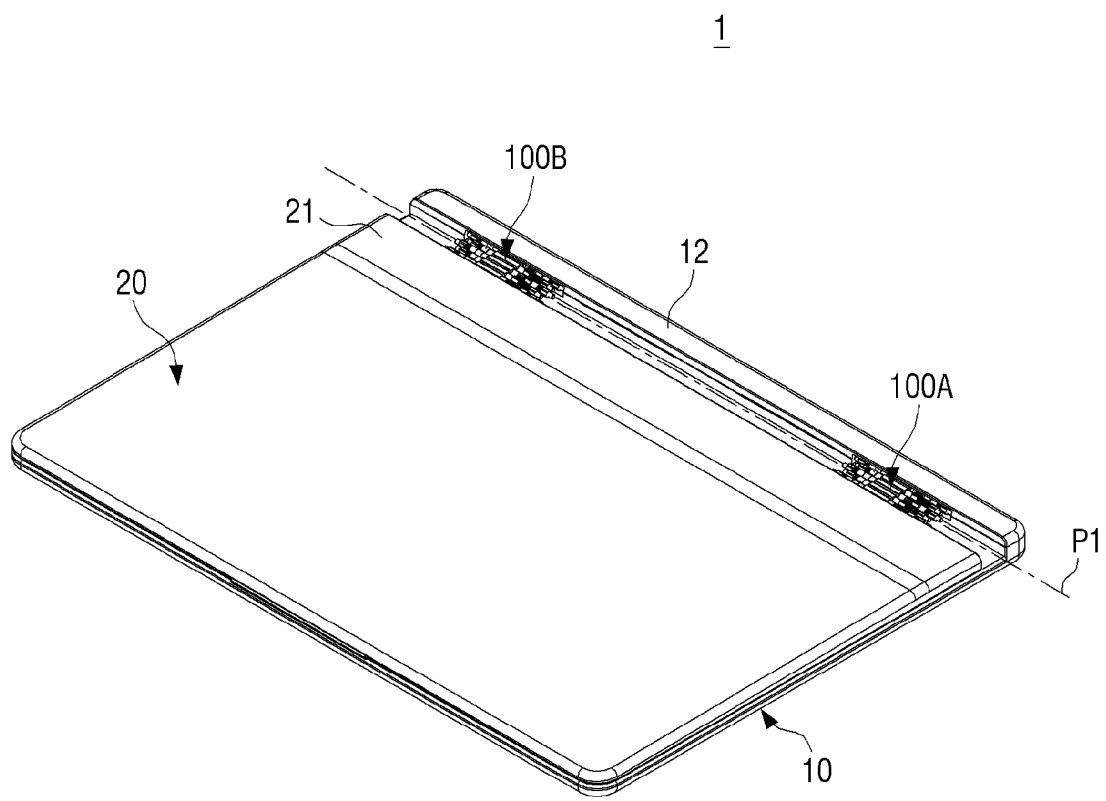
FIG. 5 is a perspective view illustrating the portable electronic device of FIG. 1 in which a cover unit is omitted.

FIG. 5 is a perspective view that illustrates the portable electronic device 1 in which the cover unit 30 is omitted. Referring to FIG. 5, the portable electronic device 1 may include the two hinge assemblies 100A and 100B, which may be spaced apart from each other along the pivot axis P1. The hinge assemblies 100A and 100B may connect the second device unit 20 to the first device unit 10 so that the second device unit 20 may pivot about the first device unit 10.

The portable electronic device 1 may use the two hinge assemblies 100A and 100B in an exemplary embodiment, but alternatively may use only one hinge assembly or three or more hinge assemblies.

For example, the hinge assemblies 100A and 100B may have completely identical structures. The hinge assembly 100A is representatively described below, and the structure of the hinge assembly 100B may be easily understood from the description of the hinge assembly 100A.

Figure 6:
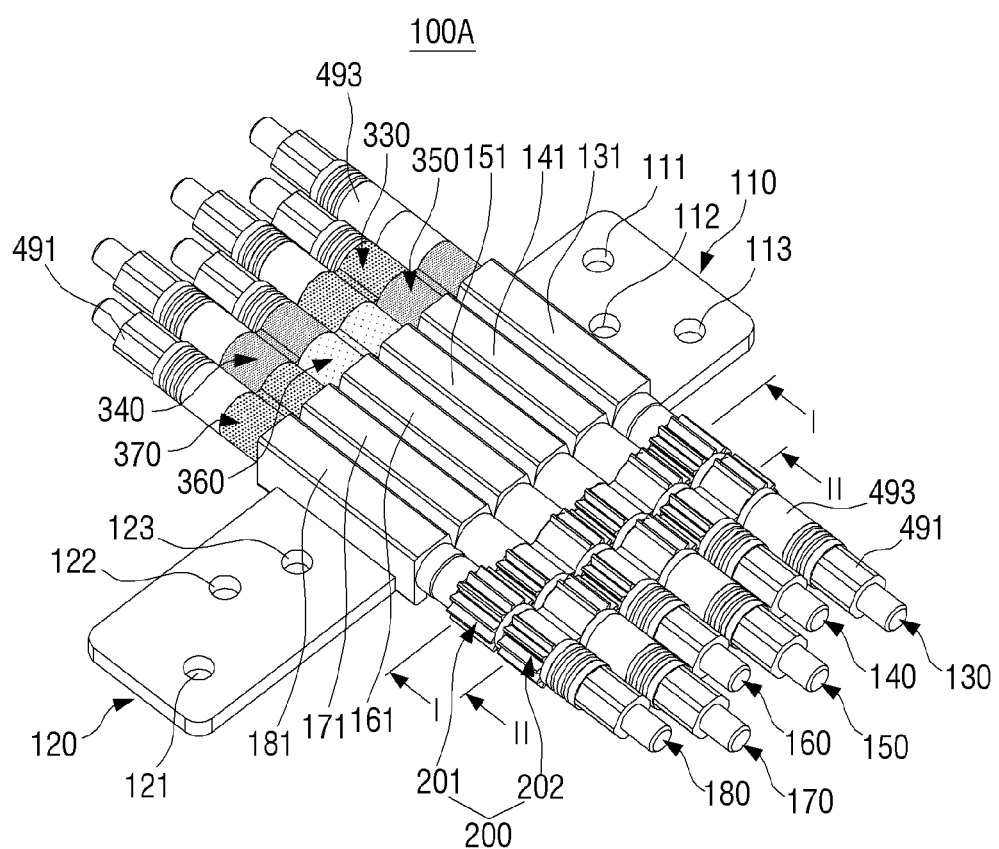
FIG. 6 is a perspective view of a hinge assembly of FIG. 5.
Figure 7A:
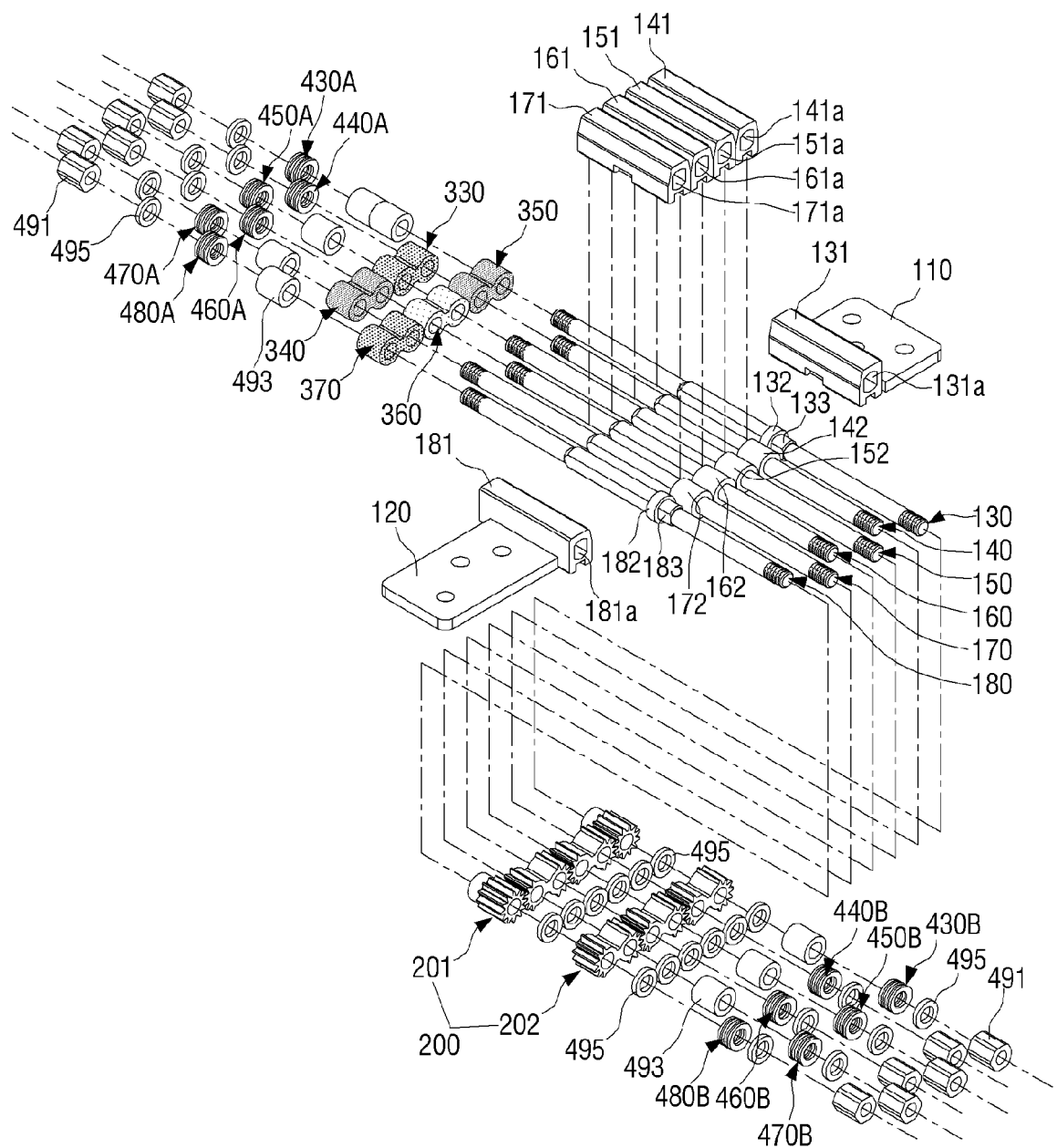
FIG. 7A is an exploded perspective view of the hinge assembly of FIG. 6.
Figure 7B:
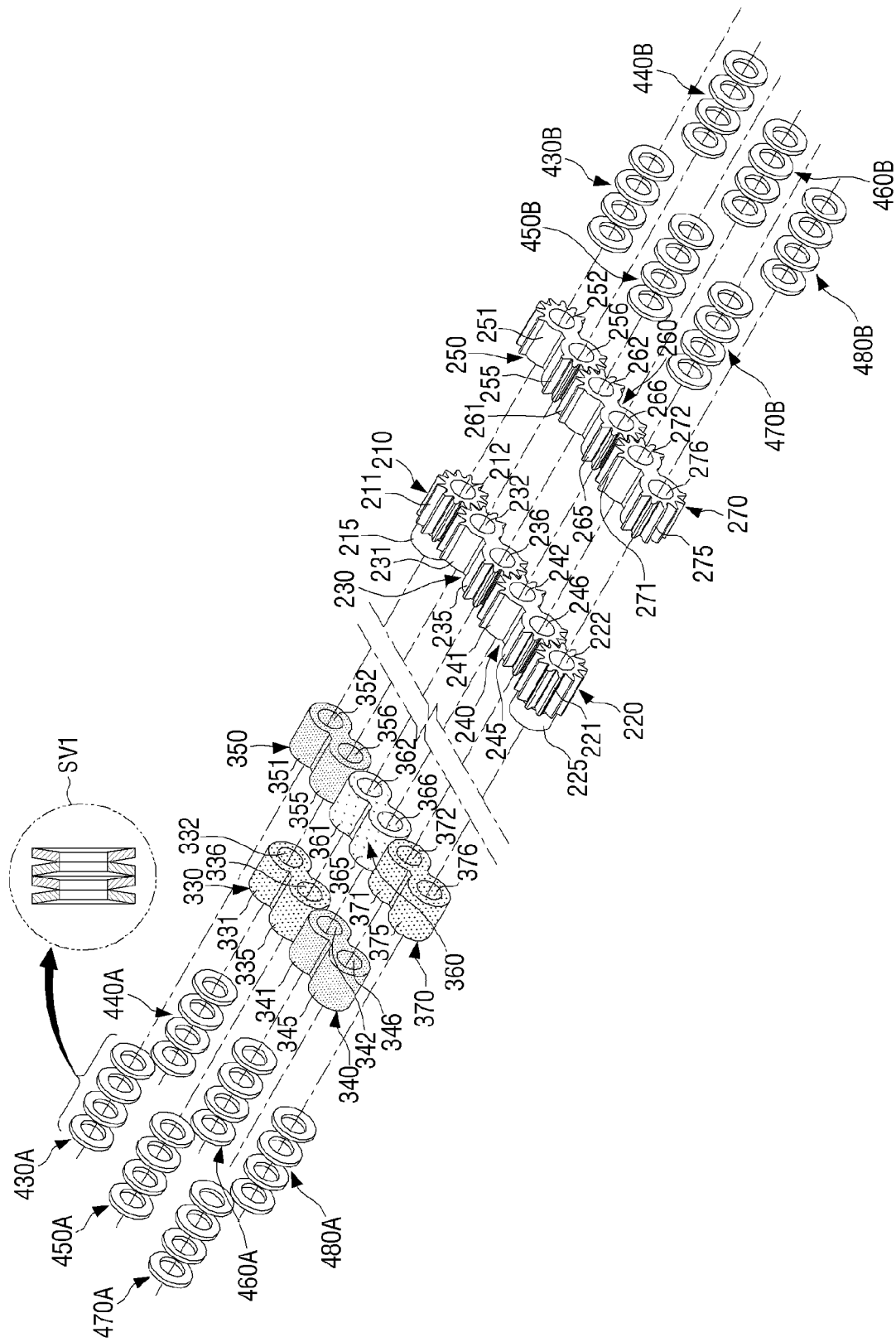
FIG. 7B is a perspective view illustrating some of parts of the hinge assembly of FIG. 7A.

FIG. 6 is a perspective view of the hinge assembly 100A. FIG. 7A is an exploded perspective view of the hinge assembly 100A of FIG. 6. FIG. 7B is a perspective view that illustrates some of parts of the hinge assembly 100A of FIG. 7A.

Referring to FIGS. 6, 7A, and 7B, the hinge assembly 100A may include first and second fixing units 110 and 120, a plurality of shaft members 130, 140, 150, 160, 170, and 180, a gear unit 200, a plurality of coupler members 330, 340, 350, 360, and 370, and a plurality of elastic units 430A, 430B, . . . , 480A, and 480B.

The first fixing unit 110 may be a part that fixes the hinge assembly 100A to the first device unit 10. For example, the first fixing unit 110 may be fixed to the hinge mounting part 12 of FIG. 2 of the first device unit 10 through screws (not illustrated). In this case, a plurality of screw through-holes 111, 112, and 113 may be formed in the first fixing unit 110.

The first fixing unit 110 may include the first cover mounting member 131, and the first cover member 31 may be installed at the first cover mounting member 131.

The second fixing unit 120 may be a part that fixes the hinge assembly 100A to the second device unit 20. For example, the second fixing unit 120 may be fixed to the lower part 21 of the second device unit 20 through screws (not illustrated). In this case, a plurality of screw through-holes 121, 122, and 123 may be formed in the second fixing unit 120.

The second fixing unit may include the sixth (i.e., last) cover mounting member 181, and the sixth (i.e., last) cover member 36 may be installed at the second cover mounting member 181.

The plurality of shaft members 130, 140, 150, 160, 170, and 180 may include first and second outer shaft members 130 and 180 and, for example, four inner shaft members 140, 150, 160, and 170 that may be disposed between the outer shaft members 130 and 180.

The plurality of shaft members 130, 140, 150, 160, 170, and 180 may be arranged to be parallel to the pivot axis P1 (see FIGS. 3 and 5) of the second device unit 20. A distance between two neighboring shaft members of the plurality of shaft members 130, 140, 150, 160, 170, and 180 may be maintained constant.

The first outer shaft members 130 may be mounted on the first cover mounting member 131 of the first fixing unit 110, and the second outer shaft members 180 may be mounted on the second cover mounting member 181 of the second fixing unit 120. Through-holes 131a and 181a with non-circular sections may be formed, respectively, in the first and second cover mounting members 131 and 181. The first and second shaft members 130 and 180 may be inserted into the through-holes 131a and 181a. Because the through-holes 131a and 181a may have non-circular sections, the first and second shaft members 130 and 180 may be fixed, respectively, to the first and second cover mounting members 131 and 181. The first and second cover mounting members 131 and 181 may be parts that may be fixed, respectively, to the first and second device units 10 and 20. The first and second outer shaft members 130 and 180 may be fixed, respectively, to the first and second device units 10 and 20 in a manner that precludes movement with respect to the first and second device units 10 and 20.

The second, third, fourth, and fifth cover mounting members 141, 151, 161, and 171 may be coupled, respectively, with the four inner shaft members 140, 150, 160, and 170. Through-holes 141a, 151a, 161a, and 171a may be formed, respectively, in the second, third, fourth, and fifth cover mounting members 141, 151, 161, and 171 with non-circular sections. For example, the inner shaft members 140, 150, 160, and 160 that correspond, respectively, to the second, third, fourth, and fifth cover mounting members 141, 151, 161, and 171 may be inserted, respectively, into the through-holes 141a, 151a, 161a, and 171a.

Spacing parts 132, 142, 152, 162, 172, and 182 that protrude in a circumferential direction may be formed, respectively, on the shaft members 130, 140, 150, 160, 170, and 180. A gear coupling part 133 with a non-circular section may be formed on the first outer shaft member 130 to be adjacent to the spacing part 132, and a gear coupling part 183 with a non-circular section may be formed on the second outer shaft member 180 to be adjacent to the spacing part 182.

The gear unit 200 may be mounted on the shaft members 130, 140, 150, 160, 170, and 180 to connect the shaft members 130, 140, 150, 160, 170, and 180 to one another through a gear mesh. The gear unit 200 may include, for example, seven gear members. For example, the gear unit 200 may include first and second outer gear members 210 and 220 and five coupling gear members 230, 240, 250, 260, and 270.

If a user applies a torque to pivot the second device unit 20, the gear unit 200 may transmit a part of the torque to the shaft members 130 through 180. In response, each shaft member 130 through 180 may pivot about at least one other neighboring shaft member, and thus a pivoting operation of the second device unit 20 may be performed.

The first outer gear member 210 may be, for example, a spur gear where a plurality of gear teeth 211 may be formed. A through-hole 212, through which the first outer shaft member 130 may pass, may be formed in the first outer gear member 210. The first outer gear member 210 may have a shaft combiner 215 that may be coupled with the gear coupling part 133 of the first outer shaft member 130. A through-hole (not illustrated) may be formed in the shaft combiner 215 to have a shape that corresponds to a shape of the gear coupling part 133. Because the gear coupling part 133 has the non-circular section, the first outer gear member 210 may be fixed to the first outer shaft member 130.

The second outer gear member 220 may be, for example, a spur gear where a plurality of gear teeth 221 may be formed. A through-hole 222, through which the second outer shaft member 180 may pass, may be formed in the second outer gear member 220. The second outer gear member 220 may have a shaft combiner 225 that may be coupled with the gear coupling part 183 of the second outer shaft member 180. A through-hole (not illustrated) may be formed in the shaft combiner 225 to have a shape that corresponds to a shape of the gear coupling part 183. Because the gear coupling part 180 has the non-circular section, the second outer gear member 220 may be fixed to the second outer shaft member 180.

A first group of coupling gear members 230 and 240 may constitute a part of the five coupling gear members 230, 240, 250, 260, and 270 and may form a first gear train 201 together with the first and second outer gear members 210 and 220. The two coupling gear members 230 and 240 that belong to the first group may be referred to, respectively, as first and second coupling gear members 230 and 240. In other words, the first gear train 201 may include the first outer gear member 210, the first coupling gear member 230, the second coupling gear member 240, and the second outer gear member 220 that may be sequentially disposed and may be in a gear mesh with one another.

A second group of coupling gear members 250, 260, and 270 may constitute the other part of the five coupling gear members 230, 240, 250, 260, and 270 and may form a second gear train 202 that may be disposed in parallel with the first gear train 201. The three coupling gear members 250, 260, and 270 that belong to the second group may be referred to, respectively, as a third coupling gear member 250, a fourth coupling gear member 260, and a fifth coupling gear member 270. In other words, the second gear train 202 may include the third coupling gear member 250, the fourth coupling gear member 260, and the fifth coupling gear member 270 that may be sequentially disposed and may be in a gear mesh with one another.

For example, the first coupling gear member 230 may include first and second gear parts 231 and 235 that may be formed as one body. The first gear part 231 may have a through-hole 232 with a circular section that may be coupled with the first inner shaft member 140 and configured to pivot about the first inner shaft member 140. The second gear part 235 may have a through-hole 236 with a circular section to be coupled with the second inner shaft member 150 and configured to pivot about the second inner shaft member 150. A distance between the first internal shaft member 140 inserted into the first gear part 231 and the second inner shaft member 150 inserted into the second gear part 232 may be maintained constant.

The first and second gear parts 231 and 235 may have, for example, spur gear shapes with the same radii. The radii of the first and second gear parts 231 and 235 may be equal to radii of the first and second outer gear members 210 and 220. The first coupling gear member 230 may be in a gear mesh with the first outer gear member 210 and the second coupling gear member 240, which may neighbor the first coupling gear member 230 through the first and second gear parts 231 and 235.

Each of the second, third, fourth, and fifth coupling gear members 240, 250, 260, and 270 may have the same shapes as that of the first coupling gear member 230. For this reason, only a brief description is provided of the second, third, fourth, and fifth coupling gear members 240, 250, 260, and 270.

For example, the second coupling gear member 240 may include first and second gear parts 241 and 245 that may form a single body, and through-holes 242 and 246 with circular sections that may be formed, respectively, in the first and second gear parts 241 and 245. A distance between the third and fourth inner shaft members 160 and 170 may be maintained constant by the second coupling gear member 240. The second coupling gear member 240 may be in a gear mesh with the first coupling gear member 230 and the second outer gear member 220, which may neighbor the second coupling gear member 240, through the first and second gear parts 241 and 245.

For example, the third coupling gear member 250 may include first and second gear parts 251 and 255 that may form a single body, and through-holes 252 and 256 with circular sections that may be formed, respectively, in the first and second gear parts 251 and 255. A distance between the first outer shaft member 130 and the first inner shaft member 140 may be maintained constant by the third coupling gear member 250. The third coupling gear member 250 may be in a gear mesh with the fourth coupling gear member 260, which may neighbor the third coupling gear member 250, through the second gear part 255.

For example, the fourth coupling gear member 260 may include first and second gear parts 261 and 265, and through-holes 262 and 266 with circular sections that may be formed, respectively, in the first and second gear parts 261 and 265. A distance between the second inner shaft member 150 and the third inner shaft member 160 may be maintained constant by the fourth coupling gear member 260. The fourth coupling gear member 260 may be in a gear mesh with the third and fifth coupling gear members 250 and 270, which may neighbor the fourth coupling gear member 260, through the first and second gear parts 261 and 265.

For example, the fifth coupling gear member 270 may include first and second gear parts 271 and 275, and through-holes 272 and 276 with circular sections that may be formed, respectively, in the first and second gear parts 271 and 275. A distance between the fourth inner shaft member 170 and the second outer shaft member 180 may be maintained constant by the fifth coupling gear member 270. The fifth coupling gear member 270 may be in a gear mesh with the fourth coupling gear member 260, which may neighbor the fifth coupling gear member 270, through the first gear part 271.

In the exemplary embodiment illustrated in FIGS. 1 through 10C, six shaft members 130 through 180 are included, the first gear train 201 includes the two coupling gear members 230 and 240 belonging to the first group, and the second gear train 202 includes the three coupling gear members 250, 260, and 270 belonging to the second group. If a different number of shaft members is selected, the number of coupling gear members of the first group and the number of coupling gear members of the second group may also be changed. The number of shaft members may be an even number (for example, 8, 10, 12, or the like).

For example, relations between the number of shaft members, the number of coupling gear members of the first group, and the number of coupling gear members of the second group may be defined as follows. When the number of a plurality of shaft members is N (where N is a natural number), the number of coupling gear members of the first group that belongs to the first gear train may be (N/2)−1, and the number of coupling gear members of the second group that belongs to the second gear train may be N/2. For example, if there are ten shaft members, four (=(10/2)−1) coupling gear members may be disposed in the first gear train, and five (=10/2) coupling gear members may be disposed in the second gear train.

A plurality of coupler members 330, 340, 350, 360, and 370 may maintain a constant distance between two neighboring shaft members. For convenience of description, the plurality of coupler members 330, 340, 350, 360, and 370 may be referred to, respectively, as a first coupler member 330, a second coupler member 340, a third coupler member 350, a fourth coupler member 360, and a fifth coupler member 370.

For example, each of the first, second, third, fourth, and fifth coupler members 330, 340, 350, 360, and 370 may include a first coupler part that may be rotatably coupled with one shaft member, a second coupler part that may be rotatably coupled with another shaft member that may neighbor the one shaft member, and the first and second coupler parts may form a single body. The first, second, third, fourth, and fifth coupler members 330, 340, 350, 360, and 370 are described below in more detail.

The first coupler member 330 may include a first coupler part 331 with a through-hole 332 with a circular section and a second coupler part 335 with a through-hole 336 with a circular section. The first coupler part 331 may be rotatably coupled with the first inner shaft member 140 through the through-hole 332. Also, the second coupler part 335 may be rotatably coupled with the second inner shaft member 150 that may neighbor the first inner shaft member 140 through the through-hole 336. A distance between the first and second inner shaft members 140 and 150 may be maintained constant by the first coupler member 330.

The second coupler member 340 may include a first coupler part 341 with a through-hole 342 with a circular section and a second coupler part 345 with a through-hole 346 with a circular section. A distance between the third and fourth inner shaft members 160 and 170 may be maintained constant by the second coupler member 340.

The third coupler member 350 may include a first coupler part 351 with a through-hole 351 with a circular section and a second coupler part 355 with a through-hole 356 with a circular section. A distance between the first outer shaft member 130 and the first inner shaft member 140 may be maintained constant by the third coupler member 350.

The fourth coupler member 360 may include a first coupler part 361 with a through-hole 362 with a circular section and a second coupler part 365 with a through-hole with a circular section. A distance between the second and third inner shaft members 150 and 160 may be maintained constant by the fourth coupler member 360.

The fifth coupler member 370 may include a first coupler part 371 with a through-hole 372 with a circular section and a second coupler part 375 with a through-hole with a circular section. A distance between the fourth inner shaft member 170 and the second outer shaft member 180 may be maintained constant by the fifth coupler member 370.

One coupling gear member and one coupler member may be used to maintain a constant distance between two neighboring shaft members. For example, a distance between the first and second inner shaft members 140 and 150 may be maintained constant by the first coupling gear member 230 and the first coupler member 330.

The plurality of elastic units 430A, 430B, ..., 480A, and 480B may elastically force gear members and coupler members toward the spacing parts 132, 142, 152, 162, 172, and 182 of shaft members. For example, the elastic units 430A, 430B, ..., 480A, and 480B may be provided by a plurality of spring washers that may be kept compressed by nut members 491. In an embodiment, the spring washers may be shaped as illustrated in a cross-section view SV1 of the elastic unit 430A in FIG. 7B. Alternatively, the elastic units 430A, 430B, ..., 480A, and 480B may be constituted as one or more coil springs.

A pair of elastic units 440A and 440B that may be mounted on the first inner shaft member 140 is representatively described below.

The spacing part 142 may be formed at an approximate center of the first inner shaft member 140.

As illustrated, for example, in FIGS. 7A and 7B, the second cover mounting member 141, the second coupler part 355 of the third coupler member 350, the first coupler part 331 of the first coupler member 330, and the elastic unit 440A may be sequentially disposed on the left side of the spacing part 142 and may be forced toward a left surface of the spacing unit 142 through the fastening of the nut members 491. The elastic unit 440A may be compressed by this force, and thus elastic force may be provided onto the left surface of the spacing part 142.

As illustrated, for example, in FIGS. 7A and 7B, the first gear part 231 of the first coupling gear member 230, the second gear part 255 of the third coupling gear member 250, and the elastic unit 440B may be sequentially disposed on the right side of the spacing part 142 may be forced toward a right surface of the spacing part 142 through the fastening of the nut members 491. The elastic unit 440B may be compressed by this force, and thus elastic force may be provided onto the right surface of the spacing part 142.

If an external torque lower than a threshold value is transmitted to the first inner shaft member 140, a torque that is opposite to and offsets the external torque may be generated by the above-described elastic forces provided by the pair of elastic units 440A and 440B. For this reason, the first inner shaft member 140 may maintain a fixed state without a pivoting operation. In other words, the first inner shaft member 140 may perform a pivoting operation only if an external torque that exceeds the threshold value is applied. For example, the threshold value may be adjusted by adjusting the fastening of the nut members 491.

According to this principle, if an angle between the second device unit 20 and the first device unit 10 is set to a specific angle, the specific angle set between the second device unit 20 and the first device unit 10 may be maintained as long as the external torque that is applied does not exceed the threshold value. Therefore, the hinge assembly 100A may have a pre-stop function at a specific angle between, for example, 0° and 120°.

In FIGS. 6 and 7A, reference numerals 493 and 495 may denote, respectively, spacers and washers.

Figure 8A:
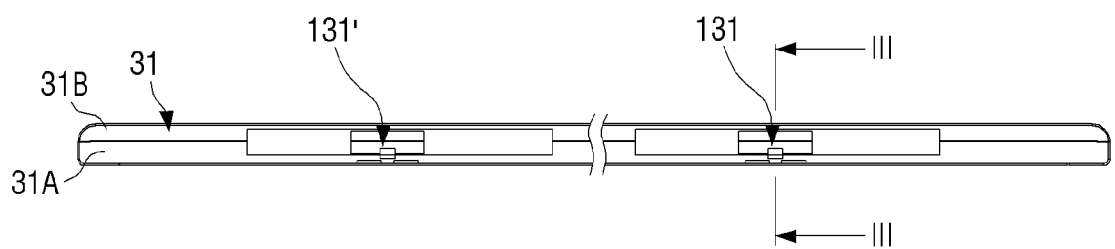
FIG. 8A is a side view illustrating a cover unit and a pair of cover mounting members that are coupled with the cover unit, according to an exemplary embodiment of the present general inventive concept.
Figure 8B:
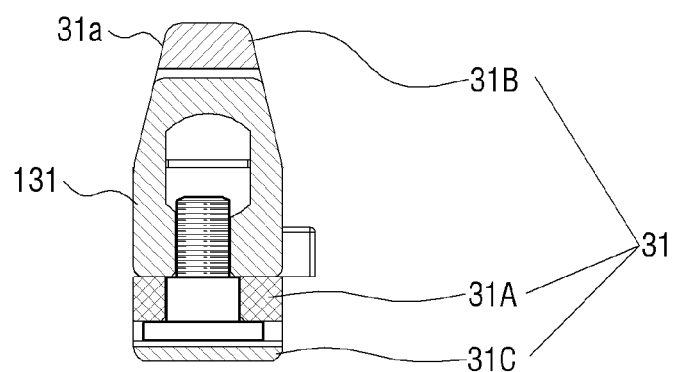
FIG. 8B is a cross-sectional view taken along line III-III of FIG. 8A.

FIG. 8A is a side view that illustrates the first cover member 31 and a pair of the first cover mounting members 131 and 131', according to an exemplary embodiment of the present general inventive concept. FIG. 8B is a cross-sectional view taken along line III-III of FIG. 8A. Although the description that follows is for the first cover member 31, the description may be similarly applied to the other cover members 32 through 36.

Referring to FIG. 8A, the cover member 31 may be coupled with the first cover mounting member 131 installed at the first outer shaft member 130 of the hinge assembly 100A. The cover member 31 may also be coupled with a first cover mounting member 131' of the hinge assembly 100B (see FIG. 5) that corresponds to the first cover mounting member 131. Therefore, the cover member 31 may cover the first outer shaft member 130 of the hinge assembly 100A and a first outer shaft member (not illustrated) of the hinge assembly 100B that corresponds to the first outer shaft member 130 of the hinge assembly 100A.

Referring to FIG. 8B, the cover member 31 may include, for example, three parts 31A, 31B, and 31C. For example, the first part 31A may be coupled with the first cover mounting member 131 through at least one screw member. The second part 31B may be coupled, for example, with an upper portion of the first part 31A, and the above-described maximum angle determining surface 31a may be formed in the second part 31B. The third part 31C may be coupled, for example, with a lower portion of the first part 31A to cover the at least one screw member that may be used to fasten the first part 31A and the first cover mounting member 131 to each other.

An operation of the hinge assembly 100A (described above) is described below with reference to FIGS. 9A through 10C.

Figure 9A:
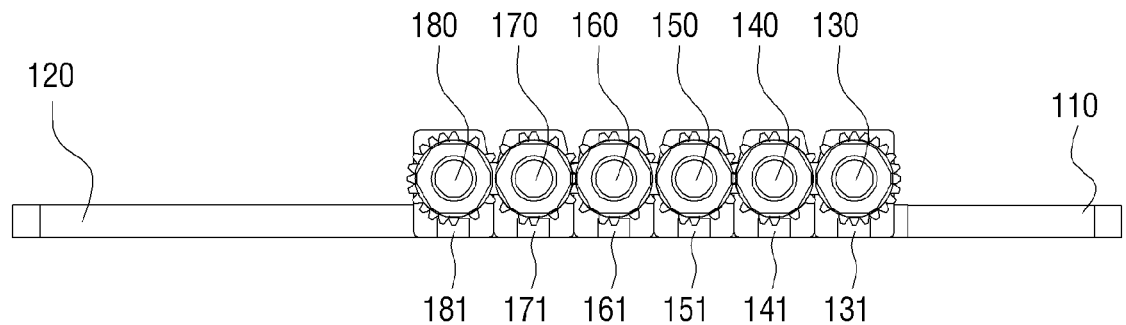
FIG. 9A is a side view of the hinge assembly of FIG. 6.
Figure 9B:
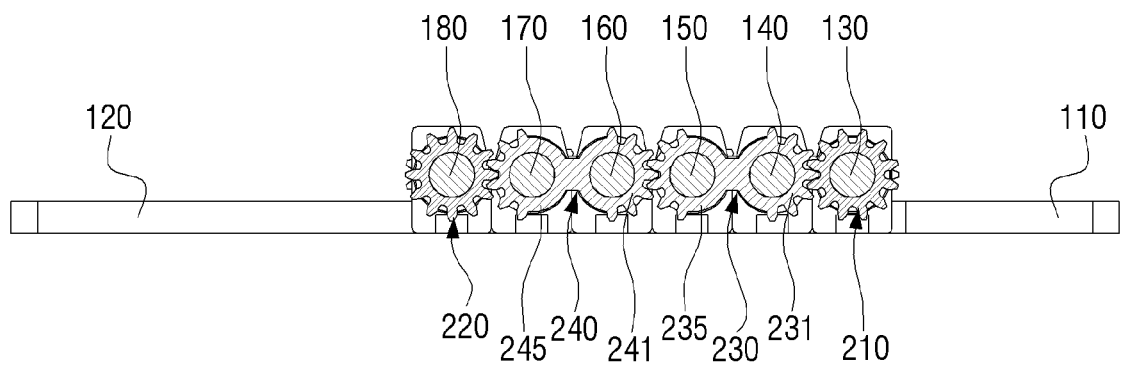
FIG. 9B is a cross-sectional view taken along line I-I of FIG. 6.
Figure 9C:
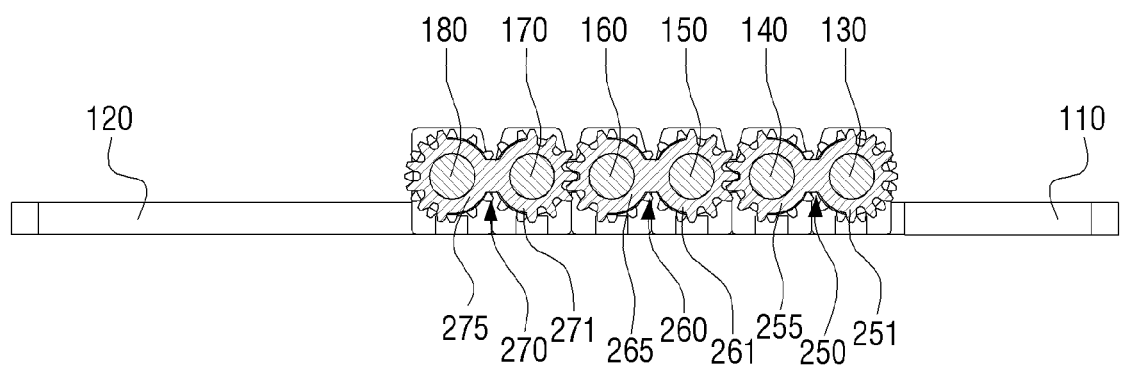
FIG. 9C is a cross-sectional view taken along line II-II of FIG. 6.

When the second device unit 20 is in a fully unfolded state, the plurality of shaft members 130 through 180 of the hinge assembly 100A may be arranged in a straight line, as illustrated in FIGS. 9A, 9B, and 9C.

Figure 10A:
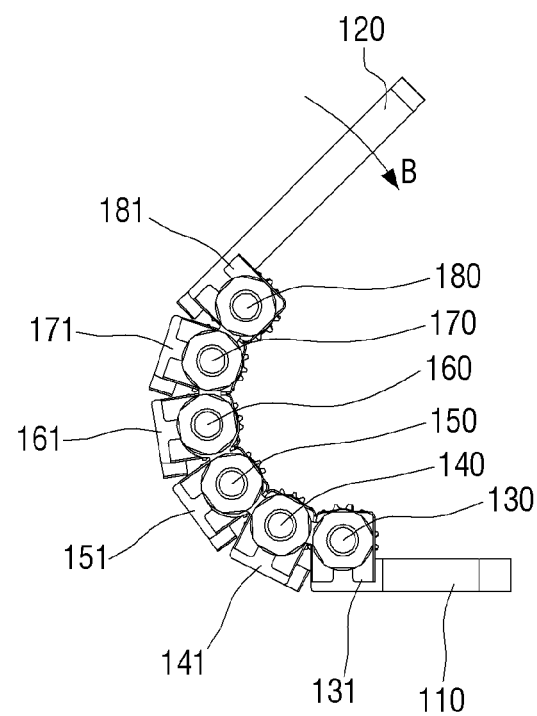
FIG. 10A is a side view illustrating a second device unit of FIG. 9A in a partly unfolded state.
Figure 10B:
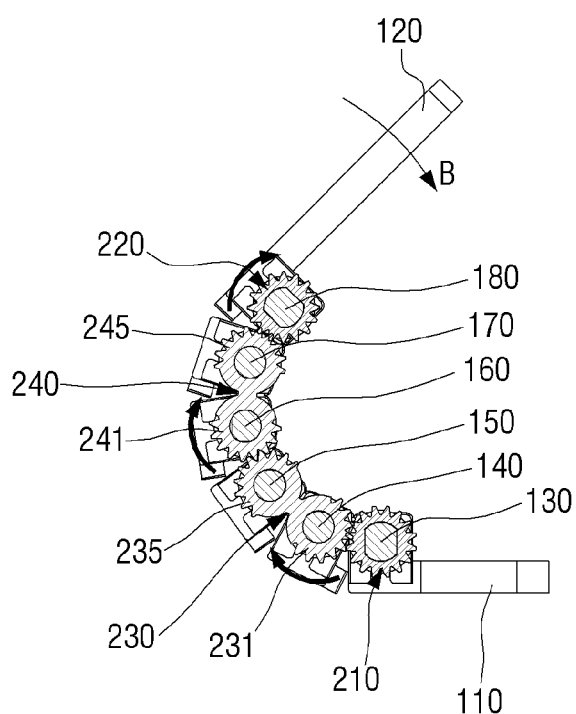
FIG. 10B is a cross-sectional view illustrating the second device unit of FIG. 9B in a partly unfolded state.
Figure 10C:
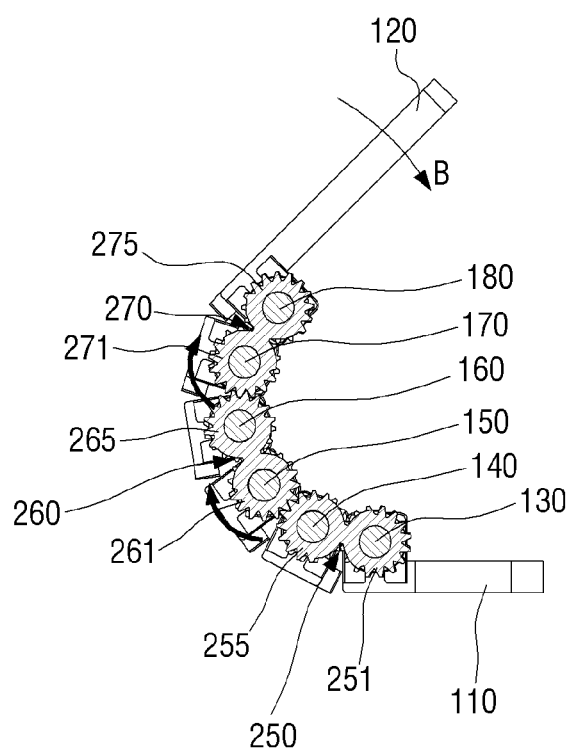
FIG. 10C is a cross-sectional view illustrating the second device of FIG. 9C that is partly unfolded.

Referring to FIGS. 10A, 10B, and 10C, if the user applies a torque in direction B that exceeds the threshold value of the second device unit 20, the torque may be transmitted to the shaft members 130 through 180 of the hinge assembly 100A by the gear unit 200 (see FIGS. 6 and 7A). Therefore, as illustrated in FIG. 10A, the shaft members 130 through 180 may perform relative pivoting motions, and a pivoting operation of the second device unit 20 performed in the direction B may be obtained through the combinations of the pivoting movements.

When performing this pivoting operation, relative pivoting movements may occur between gear members that are in a gear mesh with one another. For example, as illustrated in FIG. 10B, the first coupling gear member 230 may pivot about the first outer gear member 210 in a clockwise direction (i.e., the direction B), and the second coupling gear member 240 may pivot about the first coupling gear member 230 in the clockwise direction. Also, the second outer gear member 220 may pivot about the second coupling gear member 240 in the clockwise direction. Also, as illustrated in FIG. 10C, the fourth coupling gear member 260 may pivot about the third coupling gear member 250 in the clockwise direction, and the fifth coupling gear member 270 may pivot about the fourth coupling gear member 260 in the clockwise direction.

When the second device unit 20 is arranged to incline with respect to the first device unit 10 as illustrated in FIG. 4, the cover unit 30 that covers the hinge assembly 100A may appear as if one flexible member is bent along a smooth curved line. Therefore, the second device unit 20 may appear like it is smoothly connected to the first device unit 10. This effect may be obtained because relative pivoting movements between the shaft members 130 through 180 may be performed by gear meshes between the gear members 210 through 270 along a specific path rather than an arbitrary path.

The hinge assembly 100A according to the exemplary embodiment illustrated in FIGS. 1 through 10C may be similarly applied to a portable electronic device 1A of another exemplary embodiment that is described below with reference to FIG. 11.

In the portable electronic device 1 according to the exemplary embodiment illustrated in FIGS. 1 through 10C, torque may be transmitted through the gear unit 200 so that the plurality of shaft members 130 through 180 perform pivoting movements with respect to one another. Therefore, the second device unit 20 and the first device unit 10 may appear like they are connected to each other by a single flexible member. As a result, an external appearance of the portable electronic device 1 may be improved from an aesthetic standpoint as compared with that of an existing portable device.

Also, in the portable electronic device 1 according to the exemplary embodiment illustrated in FIGS. 1 through 10C, the hinge assembly 100A may have the pre-stop function due to the elastic units 430A, 430B, . . . , 480A, and 480B. For this reason, an angle set between the first and second device units 10 and 20 may be maintained. Also, elastic forces provided by the elastic units 430A, 430B, . . . , 480A, and 480B may be adjusted by the nut members 491, and thus a threshold value of torque that enables the second device unit 20 to pivot may be easily adjusted.

FIGS. 11 through 14 illustrate the portable electronic device 1A according to another exemplary embodiment of the present general inventive concept. The portable electronic device 1A is illustrated, for example, as a laptop computer in FIGS. 11 through 14.

The portable electronic device 1A may include a first device unit 50, a second device unit 60, and a cover unit 70.

The first device unit 50 may be a part that constitutes a main body of the portable electronic device 1A and may include, for example, a plurality of input keys 53 and a touch pad 54. For example, a controller (not illustrated) may be embedded in the first device unit 50 to control an operation of the portable electronic device 1A.

The second device unit 60 may be a part that constitutes a display unit of the portable electronic device 1A and may include, for example, a display screen 63.

The second device unit 60 may pivot about a pivot axis P3 (see FIG. 13) with respect to the first device unit 50. In other words, the second device unit 60 may pivot in a direction (i.e., in a direction B) in which the second device unit 60 is unfolded or in a direction (i.e., in a direction A) in which the second device unit 60 is folded. Therefore, the second device unit 60 may be disposed at various angles between, for example, 0° and 180° with respect to the first device unit 50. For example, as shown in FIGS. 11 and 12, the second device unit 60 may be fully unfolded to have an angle of 180° with respect to the first device unit 50. As another example, as shown in FIGS. 13 and 14, the second device unit 60 may be disposed to have an angle of 90° with respect to the first device unit 50.

The cover unit 70 may cover hinge assemblies that are described below, so that the hinge assemblies may not be seen from the outside. The cover unit 70 may be disposed between an upper part 57 of the first device unit 50 and a lower part 61 of the second device unit 60 and may include, for example, five cover members 71 through 75. The cover members 71 through 75 may be referred to, respectively, as a first cover member 71, a second cover member 72, a third cover member 73, a fourth cover member 74, and a fifth cover member 75.

Figure 14:
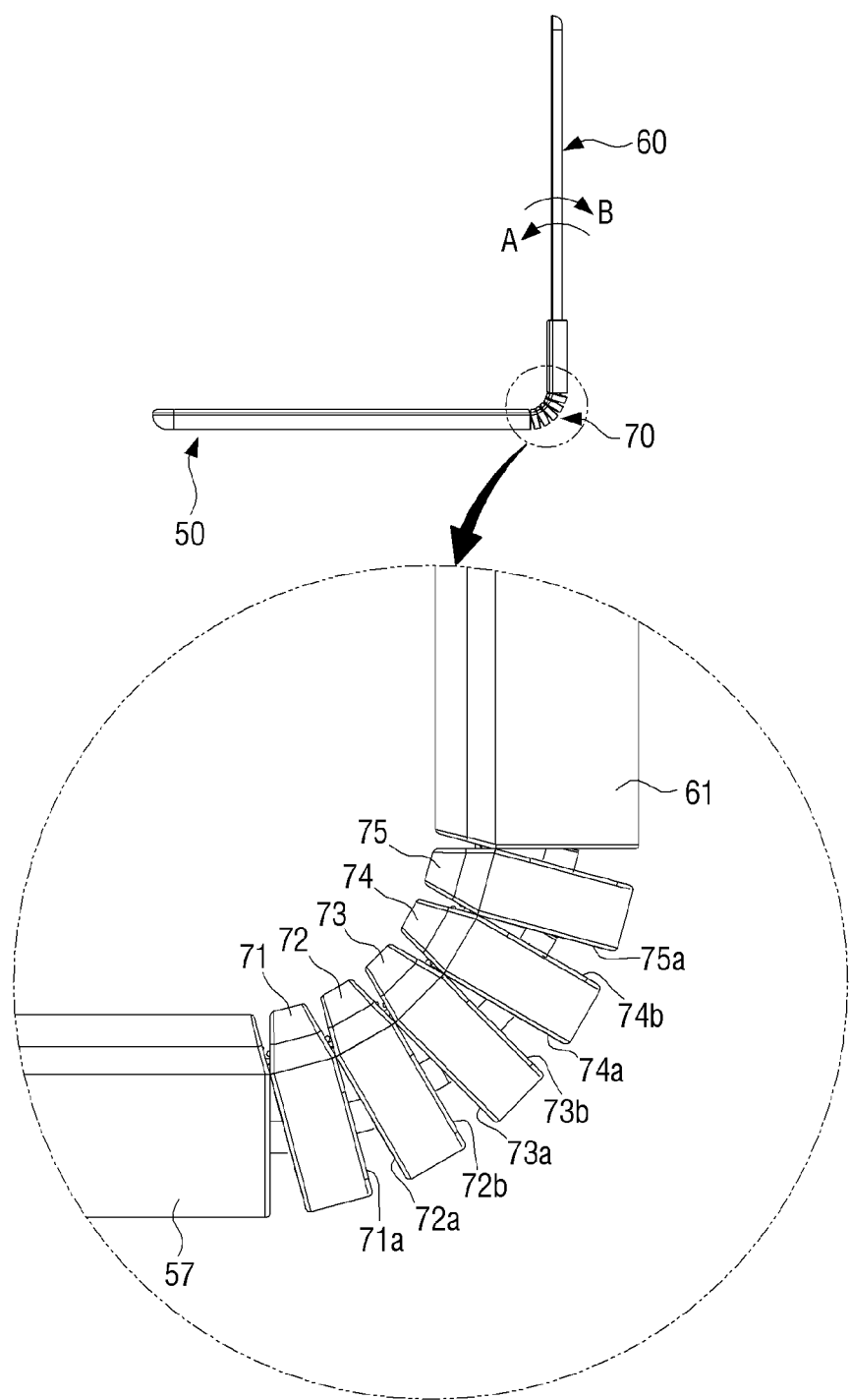
FIG. 14 is a side view of the portable electronic device of FIG. 13.

Referring to FIG. 14, the first, second, third, fourth, and fifth cover members 71 through 75 respectively may have at least one maximum angle determining surface. In other words, the first cover member 71 may have a maximum angle determining surface 71a, the second cover member 72 may have maximum angle determining surfaces 72a and 72b, and the third cover member 73 may have maximum angle determining surfaces 73a and 73b. Also, the fourth cover member 74 may have maximum angle determining surfaces 74a and 74b, and the fifth cover member 75 may have a maximum angle determining surface 75a.

Figure 11:
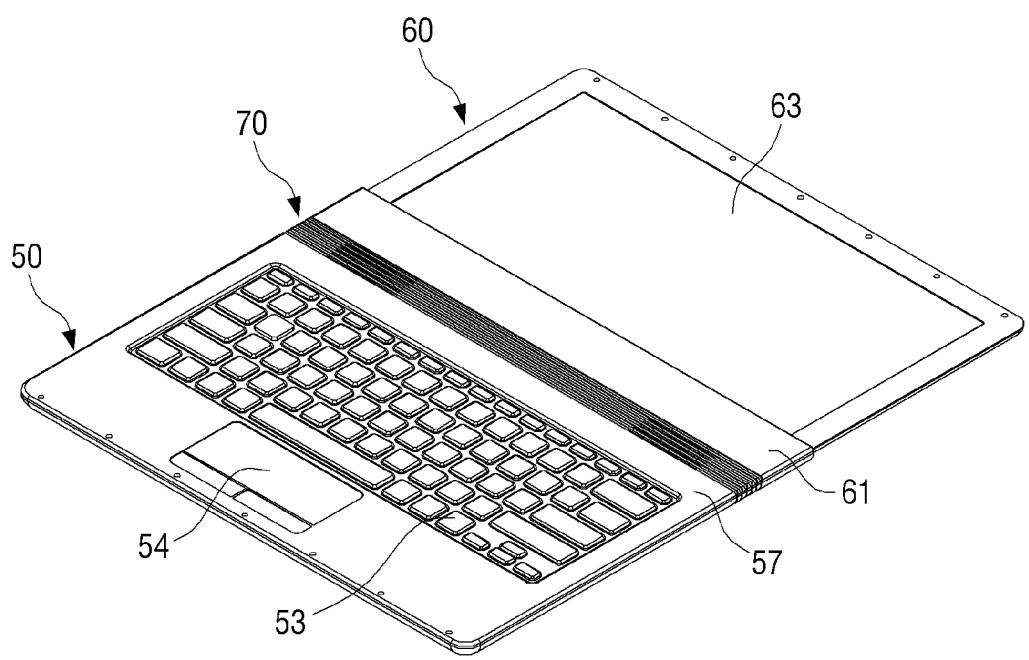
FIG. 11 is a perspective view illustrating a portable electronic device in a fully unfolded state, according to another exemplary embodiment of the present general inventive concept.
Figure 12:
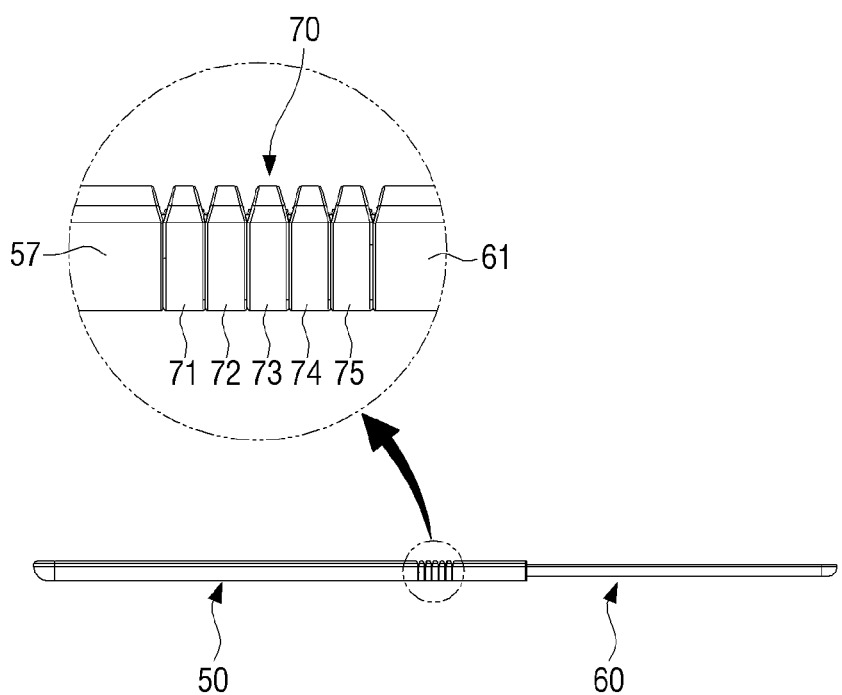
FIG. 12 is a side view of the portable electronic device of FIG. 11.
Figure 13:
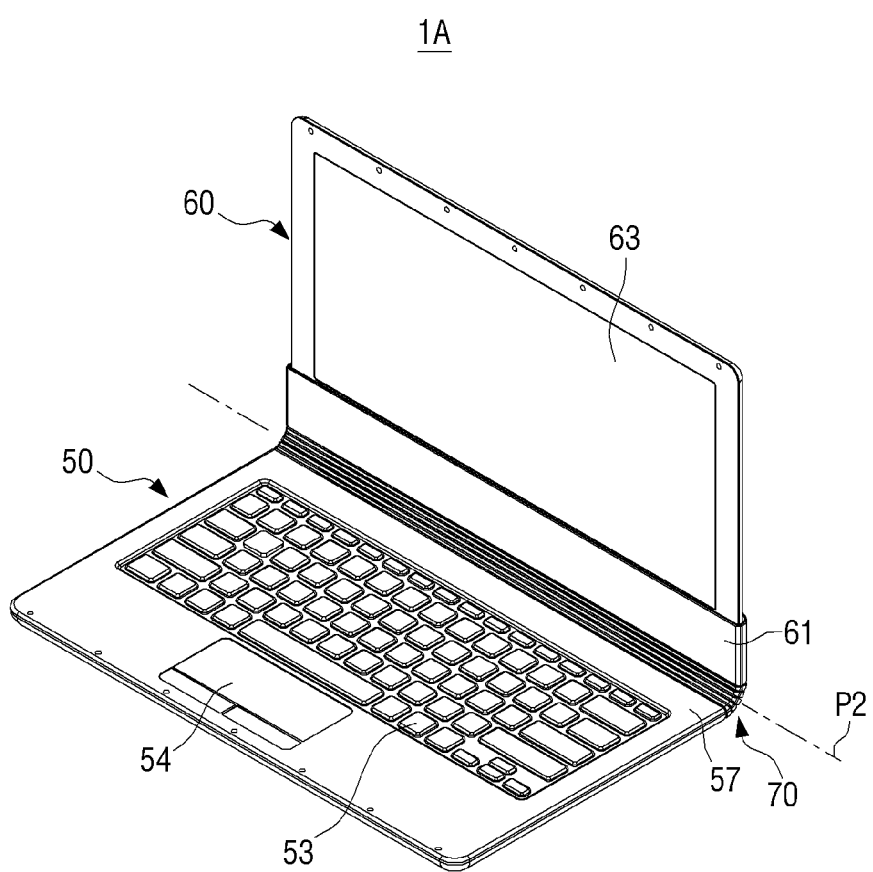
FIG. 13 is a perspective view illustrating the portable electronic device of FIG. 11 in a partly unfolded state.

If the second device unit 60 is disposed at an angle of 180° with respect to the first device unit 50 as illustrated in FIGS. 11 and 12, each maximum angle determining surface may contact at least one neighboring maximum angle determining surface. For example, the maximum angle determining surface 71a of the first cover member 71 may contact the maximum angle determining surface 72a of the second cover member 72 that may neighbor the first cover member 71. Also, the maximum angle determining surface 73a of the third cover member 73 may contact the maximum angle determining surface 72b of the second cover member 72 that may neighbor the third cover member 73. A maximum angle between the second device unit 60 and the first device unit 50 may be limited, for example, to an angle of 180° due to contacts between maximum angle determining surfaces as illustrated in FIG. 12.

In the exemplary embodiment illustrated in FIGS. 11 through 20B, the maximum angle between the second device unit 60 and the first device unit 50 may be, for example, 180°. According to other exemplary embodiments, shapes of the cover members 71 through 75 may be changed so that the maximum angle between the second device unit 60 and the first device unit 50 may have another value (for example, 270°, 360°, or the like).

Figure 15:
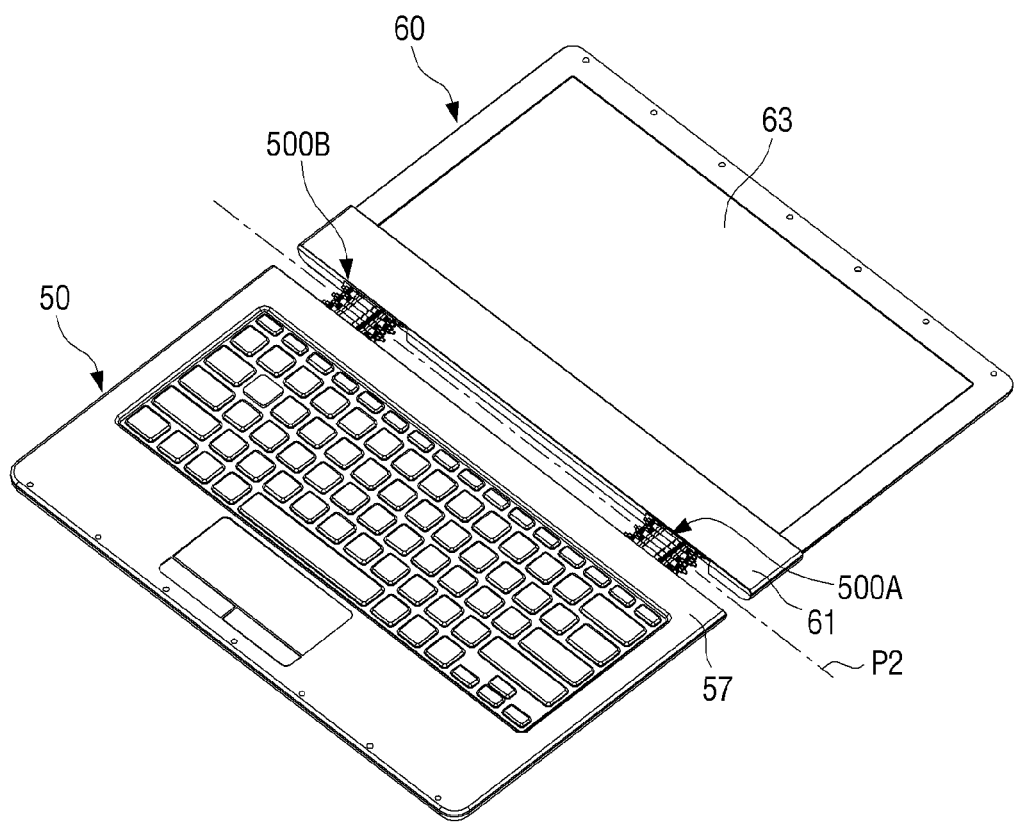
FIG. 15 is a perspective view illustrating the portable electronic device of FIG. 11 in which a cover unit is omitted.

Referring to FIG. 15, which illustrates the portable electronic device 1A in which the cover unit 70 is omitted, the portable electronic device 1A may include two hinge assemblies 500A and 500B that may be spaced apart from each other along the pivot axis P2. Pivoting movements between the first and second device units 50 and 60 may be obtained through the hinge assemblies 500A and 500B.

In the exemplary embodiment illustrated in FIGS. 11 through 20B, the portable electronic device 1A may use the two hinge assemblies 500A and 500B. Alternatively, the portable electronic device 1A may use only one hinge assembly or three or more hinge assemblies.

For example, the hinge assemblies 500A and 500B may have the completely same structures. The hinge assembly 500A is representatively described below, and the structure of the hinge assembly 500B may be easily understood from the description of the hinge assembly 500A.

Figure 16:
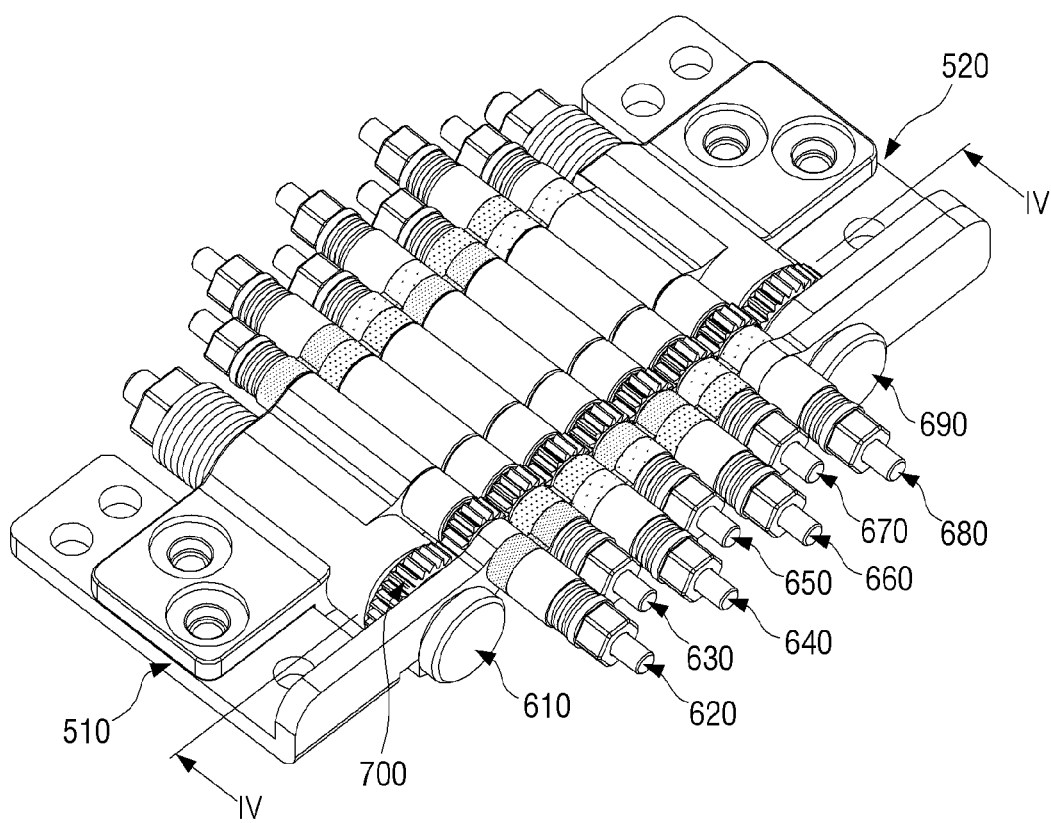
FIG. 16 is a perspective view of a hinge assembly of FIG. 15.
Figure 17A:
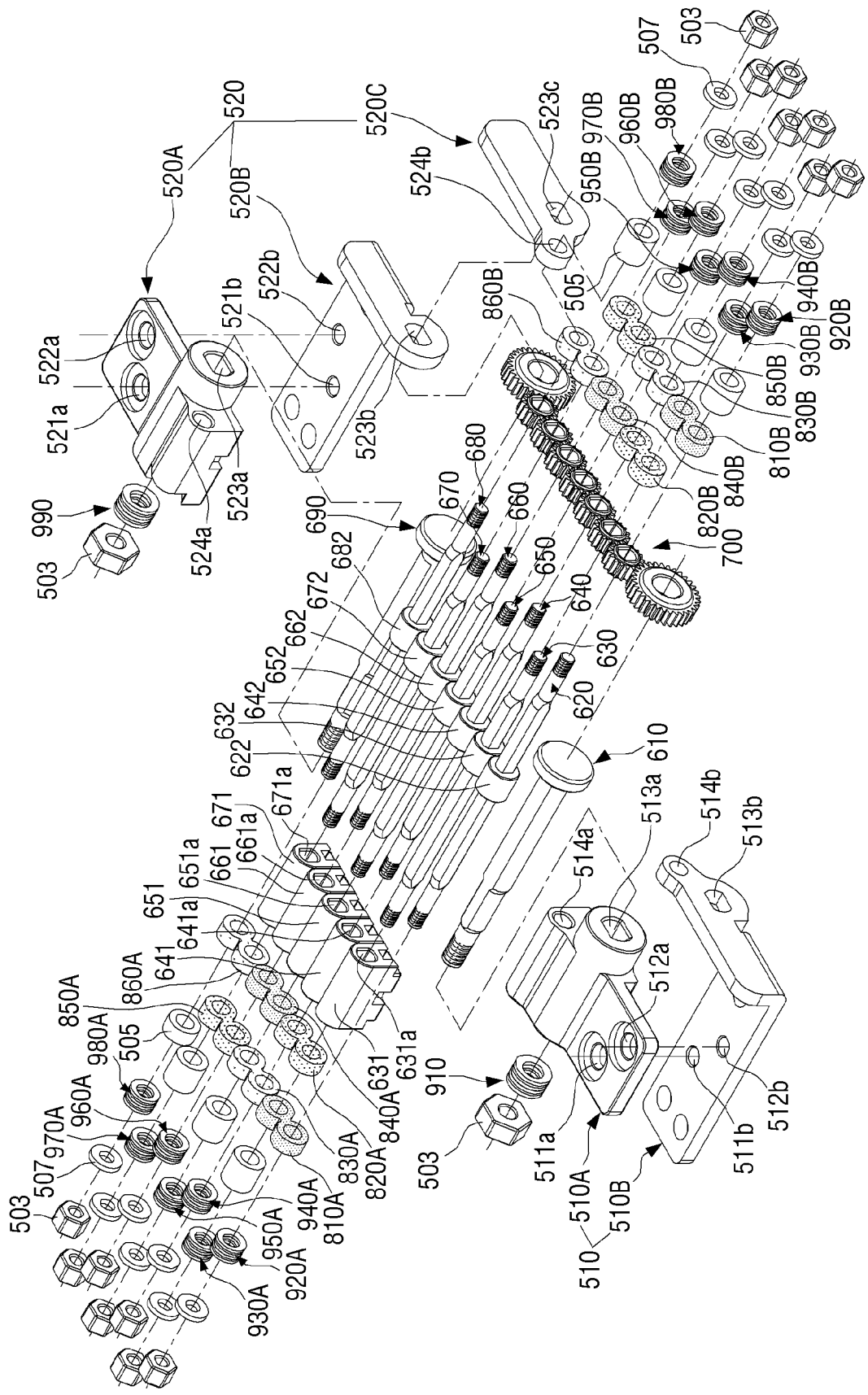
FIG. 17A is an exploded perspective view of the hinge assembly of FIG. 16.
Figure 17B:
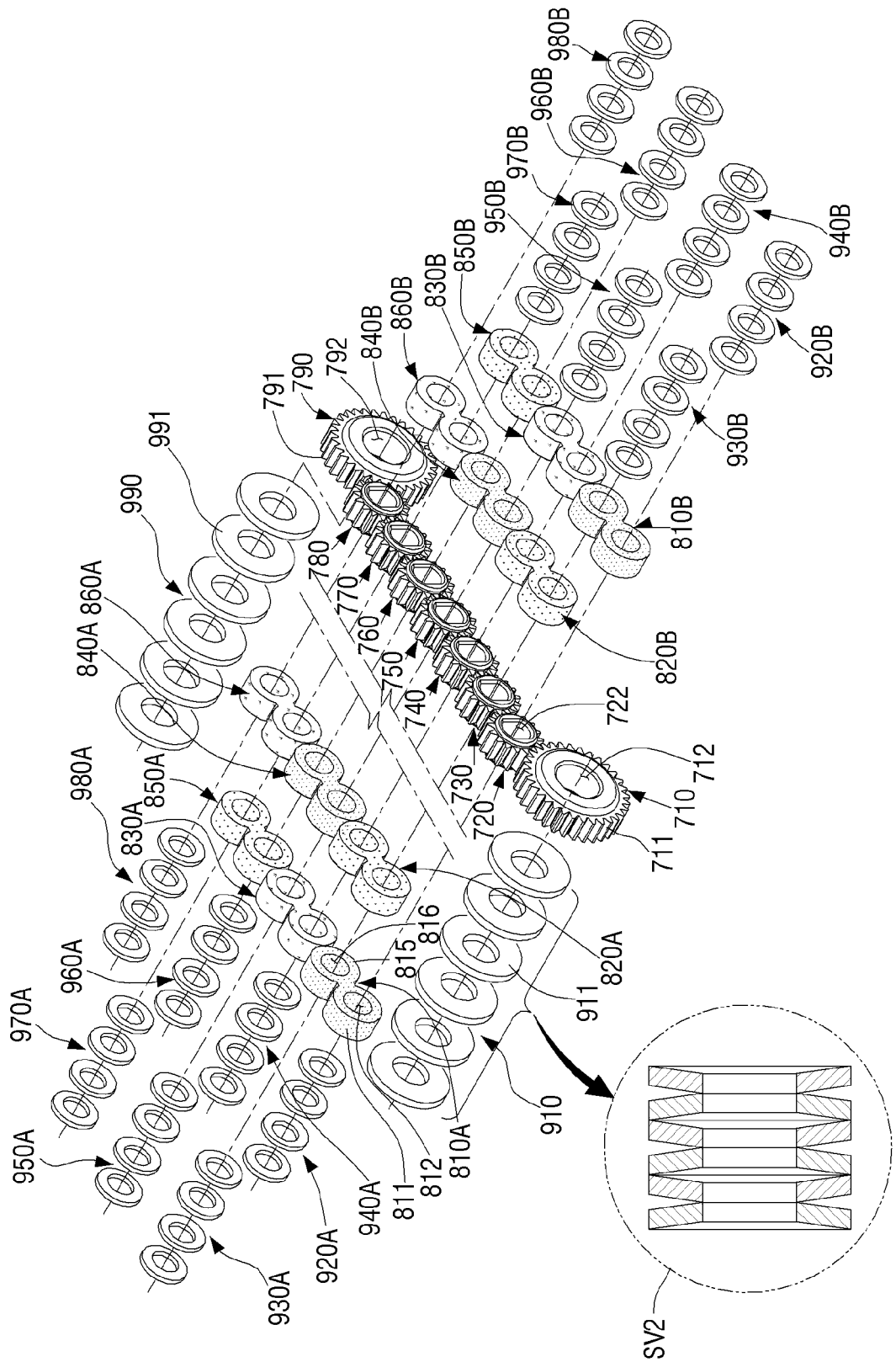
FIG. 17B is a perspective view illustrating some of parts of the hinge assembly of FIG. 17A.

Referring to FIGS. 16, 17A, and 17B, the hinge assembly 500A may include first and second fixing units 510 and 520, a plurality of shaft members 610 through 690, a gear unit 700, a plurality of coupler members 810A, 810B, . . . , 860A, and 860B, and a plurality of elastic units 910, 920A, 920B, . . . , 980A, 980B, and 990.

The first fixing unit 510 may fix the hinge assembly 500A to the first device unit 50. The first fixing unit 510 may include first and second fixing members 510A and 510B. According to alternate embodiments, the first and second fixing members 510A and 510B may be formed as a single body.

For example, two screw through-holes 511a and 512a may be formed in the first fixing member 510A, and two screw through-holes 511b and 512b may be formed in the second fixing member 510B. The first and second fixing members 510A and 510B may be fixed to the first device unit 50 through one screw member (not illustrated) that passes through the screw through-holes 511a and 511b and another screw member (not illustrated) that passes through the screw through-holes 512a and 512b.

The second fixing unit 520 may fix the hinge assembly 500A to the second device unit 60. The second fixing unit 520 may include a third fixing member 520A, a fourth fixing member 520B, and a fifth fixing member 520C. According to alternate embodiments, the third, fourth, and fifth fixing members 520A, 520B, and 520C may be formed as a single body.

For example, two screw through-holes 521a and 522a may be formed in the third fixing member 520A, and two screw through-holes 521b and 522b may be formed in the fourth fixing member 520B. The third and fourth fixing members 520A and 520B may be fixed to the second device unit 60 through one screw member (not illustrated) that passes through the screw through-holes 521a and 521b and another screw member (not illustrated) that passes through the screw through-holes 522a and 522b.

The plurality of shaft members 610 through 690 may include first and second outer shaft members 610 and 690 that may be disposed at outermost locations, and, for example, seven inner shaft members 620 through 680 that may be disposed between the first and second outer shaft members 610 and 690. The seven inner shaft members 620 through 680 may be referred to, respectively, as a first inner shaft member 620, a second inner shaft member 630, a third inner shaft member 640, a fourth inner shaft member 650, a fifth inner shaft member 660, a sixth inner shaft member 670, and a seventh inner shaft member 680.

The plurality of shaft members 610 through 690 may be arranged to be parallel to the pivot axis P2 (see FIGS. 13 and 15). A distance between two neighboring ones of the plurality of shaft members 610 through 690 may be maintained constant.

Referring to FIG. 17A, a first mounting hole 513a with a non-circular section and a second mounting hole 514a with a circular section may be formed in the first fixing member 510A. Two through-holes 513b and 514b that correspond to the first and second mounting holes 513a and 514a may be formed in the second fixing member 510B. The first outer shaft member 610 may be disposed to pass through the first mounting hole 513a with the non-circular section so as to be fixedly mounted on the first fixing member 510A. The first inner shaft member 620 may be disposed to pass through the second mounting hole 514a with the circular section so as to be pivotably mounted on the first fixing member 510A.

For example, the first outer shaft member 610 and the first inner shaft member 620, which may neighbor the first outer shaft member 610, may be commonly mounted on the first fixing member 510A. A distance between the first outer shaft member 610 and the first inner shaft member 620 may be maintained constant.

Referring to FIG. 17A again, a third mounting hole 523a with a non-circular section and a fourth mounting hole 524a with a circular section may be formed in the third fixing member 520A. A through-hole 523b that corresponds to the third mounting hole 523a may be formed in the fourth fixing member 520B, and a through-hole 523c that corresponds to the third mounting hole 523a and a through-hole 524b that corresponds to the fourth mounting hole 524a may be formed in the fifth fixing member 520C. The second outer shaft member 690 may be disposed to pass through through-holes 523b and 523c and the third mounting hole 523a with the non-circular sections so as to be fixedly mounted on the third fixing member 520A. The seventh inner shaft member 680 may be disposed to pass through the through-hole 524b and the fourth mounting hole 524a with the circular sections so as to be pivotably mounted on the third fixing member 520A.

For example, the second outer shaft member 690 and the seventh inner shaft member 680, which may neighbor the second outer shaft member 690, may be commonly mounted on the third fixing member 520A. A distance between the second outer shaft member 690 and the seventh inner shaft member 680 may be maintained constant.

Cover mounting members 631, 641, 651, 661, and 671 may be mounted, respectively, on approximate centers of the second, third, fourth, fifth, and sixth inner shaft members 630, 640, 650, 660, and 670. The cover mounting members 631, 641, 651, 661, and 671 may be disposed to enclose the second, third, fourth, fifth, and sixth inner shaft members 630, 640, 650, 660, and 670 that correspond, respectively, to the cover mounting members 631, 641, 651, 661, and 671. In other words, the second, third, fourth, fifth, and sixth inner shaft members 630, 640, 650, 660, and 670 may be disposed to pass, respectively, through the cover mounting members 631, 641, 651, 661, and 671. As illustrated in FIG. 17A, through-holes 631a, 641a, 651a, 661a, and 671a, through which the second, third, fourth, fifth, and sixth inner shaft members 630, 640, 650, 660, and 670 may pass, may be formed in the cover mounting members 631, 641, 651, 661, and 671.

As illustrated in FIG. 17A, the through-holes 631a, 641a, 651a, 661a, and 671a may have non-circular sections, and parts of the second, third, fourth, fifth, and sixth inner shaft members 630, 640, 650, 660, and 670 may be inserted, respectively, into the through-holes 631a, 641a, 651a, 661a, and 671a with the non-circular sections. The cover mounting members 631, 641, 651, 661, and 671 may be fixed, respectively, to the second, third, fourth, fifth, and sixth inner shaft members 630, 640, 650, 660, and 670 so as not to move with respect to, respectively, the second, third, fourth, fifth, and sixth inner shaft members 630, 640, 650, 660, and 670.

Spacing parts 622, 632, 642, 652, 662, 672, and 682 with cylindrical shapes may be formed, respectively, on the inner shaft members 620 through 680.

Referring to FIGS. 17A and 17B, the gear unit 700 may be mounted on the shaft members 610 through 690 to enable the shaft members 610 through 690 to be in a gear mesh with one another. The gear unit 700 may include, for example, nine gear members. For example, the gear unit 700 may include first and second outer gear members 710 and 790, and first through seventh inner gear members 720, 730, 740, 750, 760, 770, and 780. The nine gear members 710 through 790 may be in a gear mesh with one another to form one gear train.

If a user applies a torque to pivot the second device unit 60, the torque may be transmitted to the inner shaft members 620 through 680 through the gear unit 700, and thus the inner shaft members 620 through 680 may pivot with respect to other neighboring shaft members. As a result, a pivoting operation of the second device unit 60 may be performed.

The first outer gear member 710 may be provided, for example, as a spur gear with an outer surface on which a plurality of gear teeth 711 may be formed. The first outer gear member 710 may be mounted on the first outer shaft member 610 to pivot about the first outer shaft member 610. For this, a through-hole 712, with a circular section through which the first outer shaft member 610 may pass, may be formed in the first outer gear member 710.

The second outer gear member 790 may have, for example, the same shape as the first outer gear member 710. The second outer gear member 790 may be provided, for example, as a spur gear with an outer surface on which a plurality of gear teeth 791 may be formed. The second outer gear member 790 may be mounted on the second outer shaft member 690 to pivot about the second outer shaft member 690. For this, a through-hole 792, with a circular section through which the second outer shaft member 690 may pass, may be formed in the second outer gear member 790.

For example, first through seventh inner gear members 720, 730, 740, 750, 760, 770, and 780 may be provided as spur gears with the same shapes. The first through seventh inner gear members 720, 73, 740, 750, 760, 770, and 780 may be fixedly coupled with the inner shaft members 620, 630, 640, 650, 660, 670, and 680 that correspond, respectively, to the first through seventh inner gear members 720, 73, 740, 750, 760, 770, and 780. For this, through-holes, through which the inner shaft members 620, 630, 640, 650, 660, 670, and 680 may pass, may be formed, respectively, in the first through seventh inner gear members 720, 73, 740, 750, 760, 770, and 780 to have non-circular sections. For example, through-hole 722, with a non-circular section as illustrated in FIG. 17B, may be formed in each inner gear member.

In the exemplary embodiment illustrated in FIGS. 11 through 20B, radii of the two outer gear members 710 and 790, for example, may be greater than radii of the seven inner gear members 720 through 780. However, according to other alternate embodiments, the radii of the outer gear members 710 and 790 may be equal to the radii of the inner gear members 720 through 780.

The plurality of coupler members 810A, 810B, ..., 860A, and 860B may maintain a constant distance between two neighboring inner shaft members. For example, the distance between the two neighboring shaft members may refer to a distance between central axes of two shaft members. For convenience of description, the plurality of coupler members 810A, 810B, ..., 860A, and 860B may be referred to, respectively, as first coupler members 810A and 810B, second coupler members 820A and 820B, third coupler members 830A and 830B, fourth coupler members 840A and 840B, fifth coupler members 850A and 850B, and sixth coupler members 860A and 860B.

For example, each coupler member may include a first coupler part that is pivotably coupled with one inner shaft member and a second coupler part that is pivotably coupled with another shaft member that may neighbor the one shaft member. Also, the first and second parts may be formed, for example, as a single body.

The first coupler member 810A is representatively described below with respect to the shapes of coupler members. The first coupler member 810A may include first and second coupler parts 811 and 815 that may be formed, for example, as a single body. A through-hole, with a circular section through which the first inner shaft member 620 may pass, may be formed in the first coupler part 811. Also, a through-hole 816, with a circular section through which the second inner shaft member 630 may pass, may be formed in the second coupler part 815. A distance between the first and second inner shaft members 620 and 630 that may be connected to each other by the first coupler member 810A may be maintained constant.

Two neighboring inner shaft members may be connected to each other by two coupler members. For example, the first and second inner shaft members 620 and 630 are described below. The distance between the first and second inner shaft members 620 and 630 may be maintained constant by the pair of first coupler members 810A and 810B.

The plurality of elastic units 910, 920A, 920B, ..., 980A, 980B, and 990 may be divided, for example, into first and second outer elastic units 910 and 990 included in the first and second outer shaft members 610 and 690, and first through seventh elastic units 920A, 920B, ..., 980A, 980B included in the first through seventh inner shaft members 620 through 680.

Elastic force provided by the first outer elastic unit 910 may generate a friction force between the first fixing member 510A and the first outer gear member 710. The friction force may contribute to a generation of a torque that limits pivoting of the first outer gear member 710. In the exemplary embodiment illustrated in FIGS. 11 through 20B, the first outer elastic unit 910 may include, for example, a plurality of spring washers 911. In an embodiment, the spring washers 911 may be shaped as illustrated in a cross-section view SV2 of the first outer elastic unit 910 illustrated in FIG. 17B.

According to another alternate embodiment, the first outer elastic unit 910 may be provided as a coil spring. Each spring washer 911 may be kept compressed by a nut member 503 that may be fastened to the first outer gear member 710.

Elastic force provided by the second outer elastic unit 990 may generate a friction force between the third fixing member 520A and the second outer gear member 790. The friction force may contribute to a generation of a torque that limits pivoting of the second outer gear member 790. In the exemplary embodiment illustrated in FIGS. 11 through 20B, the second outer elastic unit 990 may include, for example, a plurality of spring washers 991. According to another alternate embodiment, the second outer elastic unit 990 may be provided as a coil spring. Each spring washer 991 may be kept compressed by the nut member 503 that may be fastened to the second outer gear member 790.

Elastic forces provided by the first through seventh inner elastic units 920A, 920B, ..., 980A, and 980B may generate friction forces between the first through seventh inner gear members 720 through 780 and, respectively, the spacing parts 622 through 682 of the first through seventh inner shaft members 620 through 680. The friction forces may contribute to generation of torques that limit pivoting of the first through seventh inner gear members 720 through 780. In the exemplary embodiment illustrated in FIGS. 11 through 20B, each inner elastic unit may be provided as a plurality of spring washers in a manner similar to the first and second outer elastic units 910 and 990 as described above.

If the second device unit 60 is set at a specific angle, for example, between 0° and 180° with respect to the first device unit 50, and an external torque lower than a threshold value is applied to the second device unit 60, torques of an opposite direction may be generated by the elastic units 910, 920A, 920B, ..., 980A, 980B, and 990 to work on the gear members 710 through 790 to prevent movements of the gear members 710 through 790.

Therefore, the specific angle set between the second device unit 60 and the first device 50 may be maintained. The hinge assembly 500A of the exemplary embodiment illustrated in FIGS. 11 through 20B may have a pre-stop function at the specific angle between 0° and 180°. If an external torque that exceeds the threshold value is applied to the second device unit 60, a pivoting movement of the second device unit 60 may be performed. The threshold value may be adjusted to an appropriate value through the fastening of the nut members 503.

Reference numerals 505 and 507 may denote, respectively, spacers and washers.

Figure 18A:
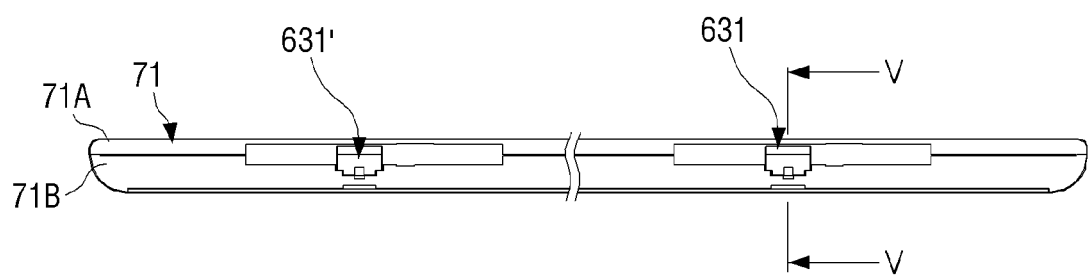
FIG. 18A is a side view illustrating a cover unit and a pair of cover mounting members that are coupled with the cover unit.
Figure 18B:
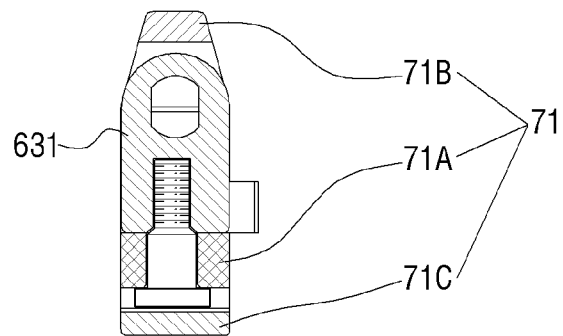
FIG. 18B is a cross-sectional view taken along line V-V of FIG. 18A.

FIG. 18A is a side view that illustrates the first cover member 71 and a pair of cover mounting members 631 and 631' that are coupled with the first cover member 71. FIG. 18B is a cross-sectional view taken along line V-V of FIG. 18A. Although the description that follows is for the first cover member 71, the description may be similarly applied to the other cover members 72 through 75.

Referring to FIG. 18A, the cover member 71 may be coupled with the first cover mounting member 631 that is mounted on the first inner shaft member 620. The cover member 71 may be coupled with a first cover mounting member 631' of the hinge assembly 500B of FIG. 15 that corresponds to the first cover mounting member 631. Therefore, the cover member 71 may cover the first inner shaft member 620 of the hinge assembly 500A and a first inner shaft member (not illustrated) of the hinge assembly 500B that corresponds to the first inner shaft member 620 of the hinge assembly 500A.

Referring to FIG. 18B, the cover member 71 may be divided, for example, into three parts 71A, 71B, and 71C. For example, the first part 71A may be coupled with the first cover mounting member 631 through at least one screw member. For example, the second and third parts 71B and 71C may be coupled, respectively, with upper and lower portions of the first part 71A to completely install the cover member 71.

An operation of the hinge assembly 500A (described above) is described below with reference to FIGS. 19A through 20B.

Figure 19A:
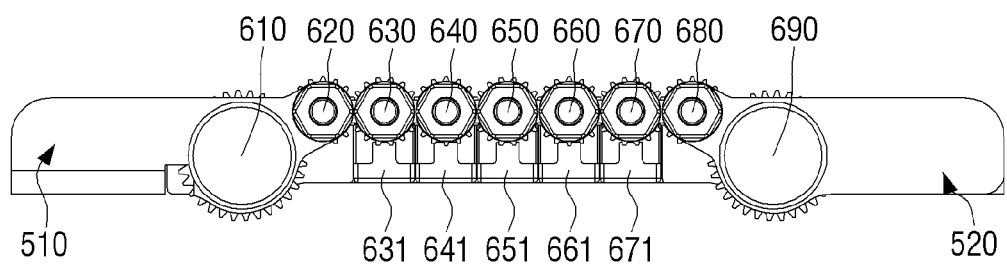
FIG. 19A is a side view of the hinge assembly of FIG. 16 in a fully unfolded state.
Figure 19B:
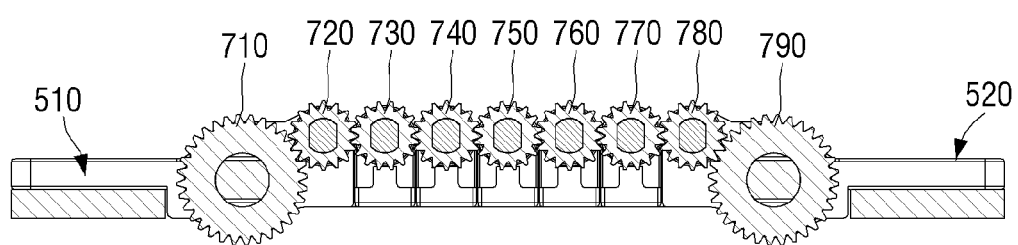
FIG. 19B is a cross-sectional view taken along line IV-IV of FIG. 16 and illustrating the hinge assembly of FIG. 16 in a fully unfolded state.

When the second device unit 60 is in a fully unfolded state, the inner shaft members 620 through 680 of the hinge assembly 500A may be arranged in a straight line, as illustrated in FIGS. 19A and 19B.

Figure 20A:
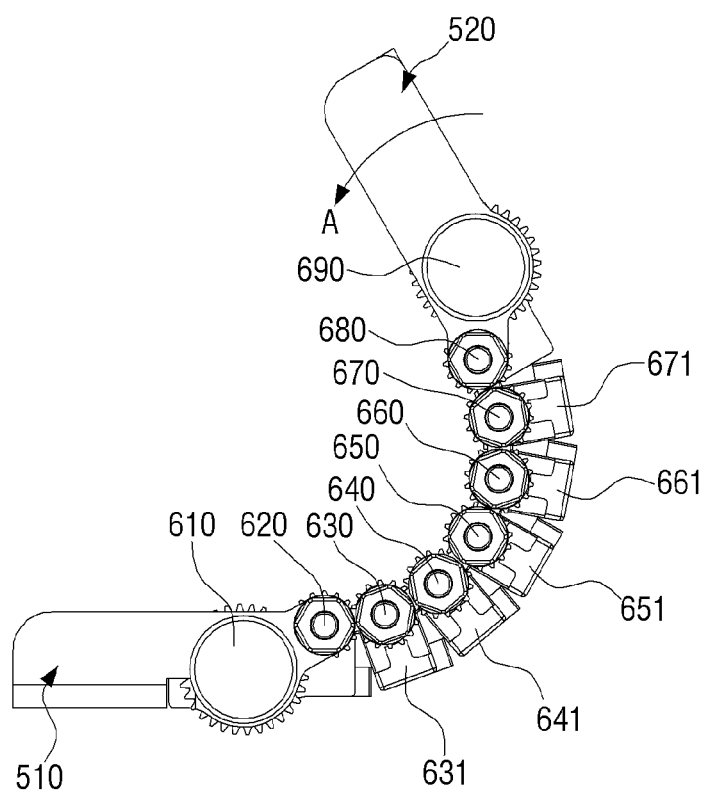
FIG. 20A is a perspective view illustrating the hinge assembly of FIG. 19A in a partly unfolded state.
Figure 20B:
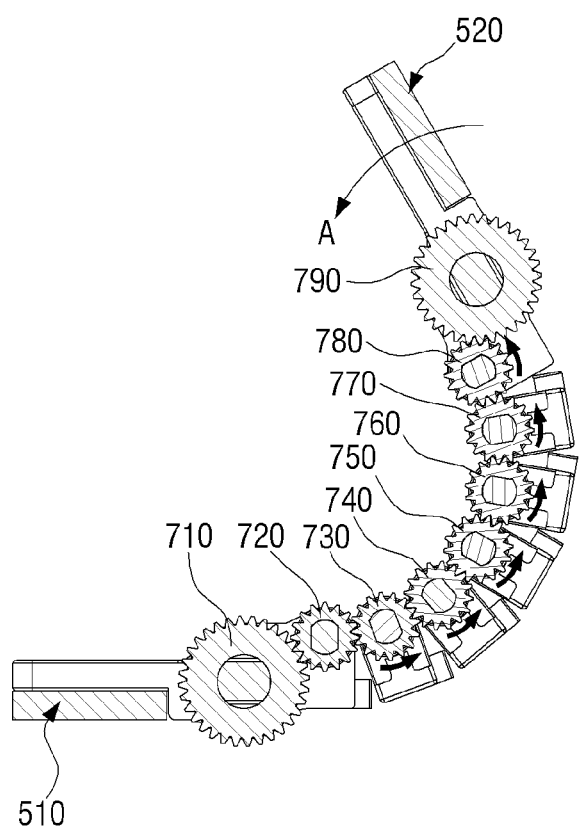
FIG. 20B is a perspective view illustrating the hinge assembly of FIG. 19B in a partly unfolded state.

Referring to FIGS. 20A and 20B, if the user applies a torque in direction A (see FIG. 14) that exceeds the threshold value of the second device unit 60, as illustrated in FIGS. 20A and 20B, the inner gear members 720 through 780 may perform relative pivoting movements due to the torque. Also, the inner shaft members 620 through 680 may perform relative pivoting movements together with the pivoting movements of the inner gear members 720 through 780.

The pivoting movements of the inner gear members 72 through 780 are described in detail below. The second inner gear member 730 may pivot in a counterclockwise direction around the first inner gear member 720. The third inner gear member 740 may pivot in the counterclockwise direction around the second inner gear member 730. The fourth inner gear member 750 may pivot in the counterclockwise direction around the third inner gear member 740. The fifth inner gear member 760 may pivot in the counterclockwise direction around the fourth inner gear member 750. The sixth inner gear member 770 may pivot in the counterclockwise direction around the fifth inner gear member 760. The seventh inner gear member 780 may pivot in the counterclockwise around the sixth inner gear member 770. The pivoting movement of the second device unit 60 in the direction A may be obtained through the combinations of the relative pivoting movements of the inner gear members 720 through 780.

When the second device unit 60 is unfolded from the first device unit 50 as illustrated in FIG. 14, the cover unit 70 that covers the hinge assembly 500A may appear as if one flexible member is bent along one smooth curve line. This may contribute to an aesthetic design of the portable electronic device 1A. This aesthetic effect may be obtained because the relative pivoting movements of the inner shaft members 620 through 680 may occur through gear meshes between the gear members 710 and 790 along a specific path rather than an arbitrary path.

The hinge assembly 500A according to the exemplary embodiment illustrated in FIGS. 11 through 20B may be similarly applied to the portable electronic device 1 of FIG. 1 according to the exemplary embodiment described above with reference to FIGS. 1 through 10C.

In the portable electronic device 1A according to the exemplary embodiment illustrated in FIGS. 11 through 20B, torque may be transmitted through the gear unit 700 to enable the plurality of inner shaft members 620 through 680 to pivot. Therefore, the second device unit 60 and the first device unit 50 may appear like they are connected to each other by a single flexible member. As a result, an external appearance of the portable electronic device 1A may be improved from an aesthetic standpoint as compared with that of an existing portable electronic device.

Also, in the portable electronic device 1A according to the exemplary embodiment illustrated in FIGS. 11 through 20B, the hinge assembly 500A may have the pre-stop function due to the elastic units 910, 920A, 920B, ..., 980A, 980B, and 990. For this reason, an angle set between the first and second device units 50 and 60 may be maintained. Also, elastic forces provided by the elastic units 910, 920A, 920B, ..., 980A, 980B, and 990 may be adjusted by the nut members 503, and thus a threshold value of torque that enables the second device unit 60 to pivot may be easily adjusted.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A portable electronic device, comprising:
   first and second device units; and
   at least one hinge assembly configured to pivotably connect the second device unit to the first device unit,
      the hinge assembly comprising:
      a first fixing unit configured to be fixed to the first device unit;
      a second fixing unit configured to be fixed to the second device unit;
      a plurality of shaft members configured to be arranged in parallel with one another, the plurality of shaft members comprising first and second outer shaft members respectively mounted on the first and second fixing units, and a plurality of inner shaft members arranged between the first and second outer shaft members;
      a gear unit mounted on the shaft members and configured to connect the plurality of shaft members with one another through a gear mesh; and a plurality of coupler members, wherein any two neighboring shaft members are connected to each other by one of the plurality of coupler members.

2. The portable electronic device of claim 1, wherein the gear unit comprises first and second gear trains configured to be arranged in parallel with each other.

3. The portable electronic device of claim 2, wherein the first gear train comprises:
a first outer gear member configured to be coupled with the first outer shaft member;
a second outer gear member configured to be coupled with the second outer shaft member; and
a first group of coupling gear members mounted on the plurality of inner shaft members, at least two neighboring inner shaft members are connected to each other by one coupling gear member.

4. The portable electronic device of claim 3, wherein the second gear train comprises a second group of coupling gear members mounted on the first outer shaft member, the second outer shaft member, and the plurality of inner shaft members.

5. The portable electronic device of claim 4, wherein a total number of the plurality of shaft members is N, a number of the first group of coupling gear members is (N/2)−1, and a number of the second group of coupling gear members is N/2, wherein N is a natural number that is an even number.

6. The portable electronic device of claim 4, wherein each of the coupling gear members comprises:
a first gear part configured to be rotatably coupled with a first shaft member of two neighboring shaft members; and
a second gear part configured to be rotatably coupled with a second shaft member of the two neighboring shaft members.

7. The portable electronic device of claim 3, wherein each of the shaft members comprises at least one elastic unit configured to prevent the second device unit from pivoting due to an external torque lower than a threshold value.

8. The portable electronic device of claim 2, wherein the first gear train comprises:
a first outer gear member configured to be mounted on the first outer shaft member;
a second outer gear member configured to be mounted on the second outer shaft member; and
a plurality of inner gear members configured to be respectively fixedly coupled with the inner shaft members.

9. The portable electronic device of claim 1, wherein each of the coupler members comprises:
a first coupler part configured to be rotatably coupled with a first shaft member of the any two neighboring shaft members; and
a second coupler part configured to be rotatably coupled with a second shaft member of the any two neighboring shaft members.

10. The portable electronic device of claim 1, further comprising:
a cover unit configured to cover the at least one hinge assembly from an outside.

11. The portable electronic device of claim 10, wherein:
the hinge assembly comprises:
a first hinge assembly; and
a second hinge assembly configured to have a same structure as the first hinge assembly and spaced apart from the first hinge assembly in a direction of a pivot axis,
the cover unit comprises a plurality of cover members configured to cover at least some of the plurality of shaft members, each of the cover members is configured to cover a first shaft member of the first hinge assembly and a shaft member of the second hinge assembly.

12. The portable electronic device of claim 11, wherein when the second device unit is disposed at a maximum angle with respect to the first device unit, each of the cover members has at least one maximum angle determining surface that interferes with a movement of a neighboring cover member.

13. A hinge assembly configured to pivotably connect first and second device units of a portable electronic device, the hinge assembly comprising:
a first fixing unit configured to be fixed to the first device;
a second fixing unit to be fixed to the second device unit;
a plurality of shaft members configured to be disposed in parallel with one another, the plurality of shaft members comprising first and second outer shaft members respectively mounted on the first and second fixing units and a plurality of inner shaft member disposed between the first and second outer shaft members;
a gear unit configured to be mounted on the plurality of shaft members so as to connect the plurality of shaft members with one another through a gear mesh; and
a plurality of coupler members, wherein any two neighboring shaft members are connected to each other by one of the plurality of coupler members.

14. A portable device, comprising:
first and second device units; and
at least one hinge assembly configured to pivotably connect the second device unit to the first device unit,
wherein the hinge assembly comprises a plurality of shaft members configured to be disposed in parallel with one another,
wherein each of the plurality of shaft members comprises at least one elastic unit configured to apply torque opposite to an external torque to the shaft member in order to prevent the second device unit from pivoting due to the external torque being lower than a threshold value; and
a plurality of coupler members, wherein any two neighboring shaft members are connected to each other by one of the plurality of coupler members.

15. The portable electronic device of claim 14, wherein the elastic unit comprises at least one spring washer configured to provide an elastic force to the shaft member in order to generate the torque opposite to the external torque.

16. The portable electronic device of claim 15, wherein the hinge assembly further comprises:
a first fixing unit configured to be fixed to the first device unit; and
a second fixing unit configured to be fixed to the second device unit,
wherein the plurality of shaft members comprise:
a first outer shaft member configured to be mounted on the first fixing unit;
a second outer shaft member configured to be mounted on the second fixing unit; and
a plurality of inner shaft members configured to be disposed between the first and second outer shaft members.

17. The portable electronic device of claim 16, wherein the hinge assembly further comprises a gear unit mounted on the shaft members to connect the plurality of shaft members with one another through a gear mesh.

18. A portable electronic device, comprising:
first and second device units;
first and second hinge assemblies configured to pivotably connect the second device unit to the first device unit, to be spaced apart from each other along a pivot shaft, and to have same structures; and a cover unit configured to cover the first and second hinge assemblies, wherein each of the hinge assemblies comprises a plurality of shaft members configured to be arranged in parallel with one another and a plurality of coupler members, wherein the cover unit comprises a plurality of cover members configured to cover some or all of the plurality of shaft members, wherein each of the cover members covers a shaft member of the first hinge assembly and a shaft member of the second hinge assembly, and wherein any two neighboring shaft members are connected to each other by one of the plurality of coupler members.

* * * * *

UNITED STATES PATENT AND TRADEMARK OFFICE
CERTIFICATE OF CORRECTION

PATENT NO.        : 9,021,657 B2
APPLICATION NO.   : 14/169273
DATED             : May 5, 2015
INVENTOR(S)       : Young-sun Park et al.

It is certified that error appears in the above-identified patent and that said Letters Patent is hereby corrected as shown below:

Claims

Claim 11, Column 22, Line 1-2
Delete "first shaft" and insert --shaft--, therefor.

Claim 16, Column 22, Line 45
Delete "claim 15," and insert --claim 14,--, therefor.

Claim 16, Column 22, Line 58
Delete "claim 16," and insert --claim 14,--, therefor.

Signed and Sealed this
Thirteenth Day of October, 2015

Michelle K. Lee
*Director of the United States Patent and Trademark Office*